(12) United States Patent
Inoue et al.

(10) Patent No.: US 9,437,778 B2
(45) Date of Patent: Sep. 6, 2016

(54) SEMICONDUCTOR LIGHT-EMITTING ELEMENT AND METHOD FOR PRODUCING THE SAME

(71) Applicant: USHIO DENKI KABUSHIKI KAISHA, Tokyo (JP)

(72) Inventors: Takahiro Inoue, Himeji (JP); Masashi Tsukihara, Himeji (JP); Kohei Miyoshi, Himeji (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 14 days.

(21) Appl. No.: 14/561,968

(22) Filed: Dec. 5, 2014

(65) Prior Publication Data

US 2015/0171271 A1    Jun. 18, 2015

(30) Foreign Application Priority Data

Dec. 13, 2013   (JP) ................. 2013-258350

(51) Int. Cl.
*H01L 33/38* (2010.01)
*H01L 33/40* (2010.01)
*H01L 33/14* (2010.01)

(52) U.S. Cl.
CPC .............. *H01L 33/38* (2013.01); *H01L 33/14* (2013.01); *H01L 33/387* (2013.01); *H01L 33/405* (2013.01); *H01L 2224/48463* (2013.01); *H01L 2933/0016* (2013.01)

(58) Field of Classification Search
CPC ...... H01L 33/14; H01L 33/38; H01L 33/405; H01L 33/387; H01L 33/42
See application file for complete search history.

(56) References Cited

U.S. PATENT DOCUMENTS

| 2011/0101304 A1* | 5/2011 | Song ................. H01L 33/0079 257/13 |
| 2012/0061704 A1* | 3/2012 | Jeong ................. H01L 33/387 257/98 |
| 2012/0299047 A1 | 11/2012 | Kim et al. |

FOREIGN PATENT DOCUMENTS

JP          2012-244158 A      12/2012

* cited by examiner

*Primary Examiner* — Thomas L Dickey
(74) *Attorney, Agent, or Firm* — Studebaker & Brackett PC

(57) ABSTRACT

The semiconductor light-emitting element includes: a substrate; a semiconductor layer that is provided over the substrate; a first electrode that is provided in contact with part of an upper surface of the semiconductor layer and includes a current supply part; a second electrode that is provided in part of a region vertically below a region where the current supply part is not provided, that is in contact with part of the semiconductor layer; and a first current blocking layer that is provided in a region including a region vertically below the current supply part and that is in contact with part of the semiconductor layer, wherein a contact resistance at an interface between the first current blocking layer and the semiconductor layer is higher than that at an interface between the second electrode and the semiconductor layer.

13 Claims, 24 Drawing Sheets

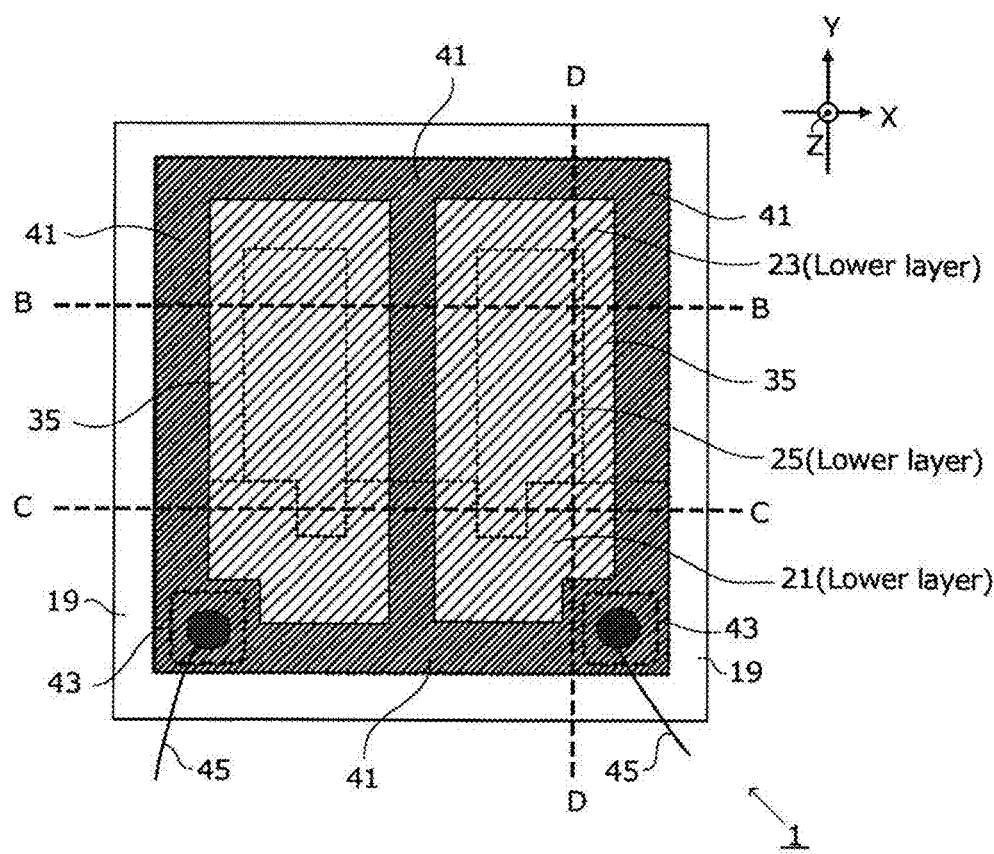

Fig.2A
(a)
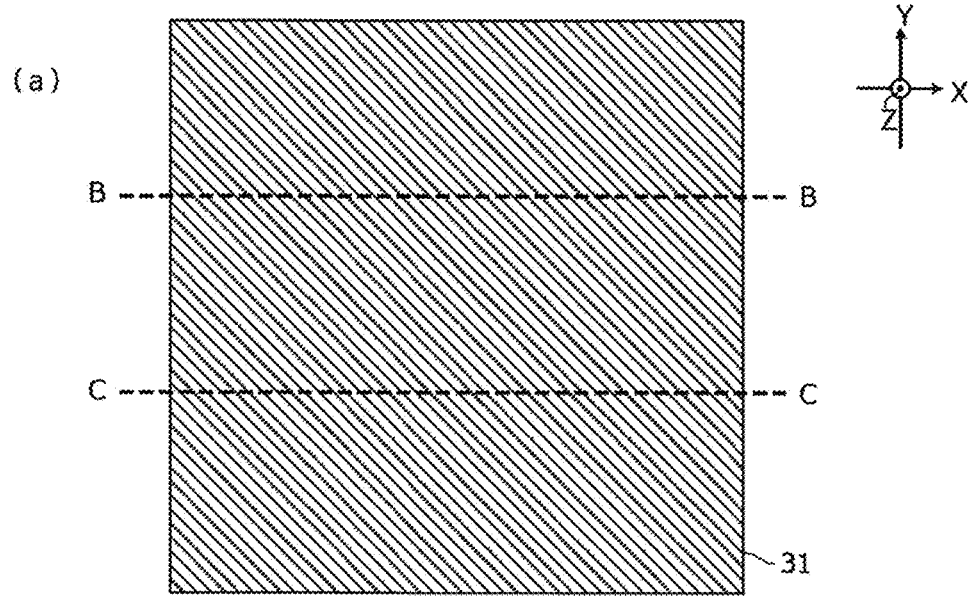
(b)
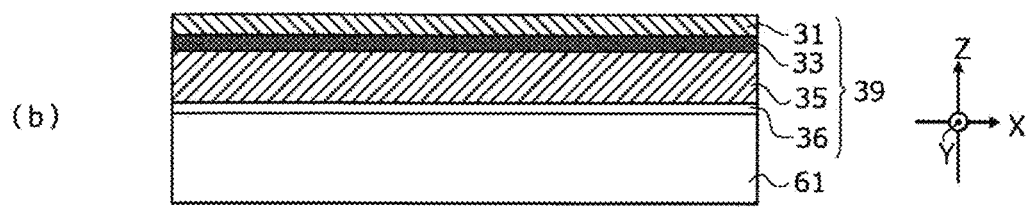
(c)
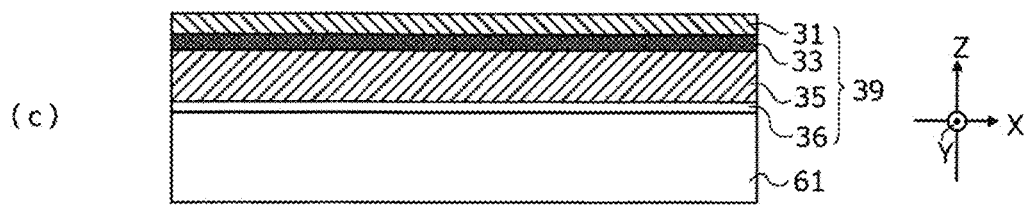

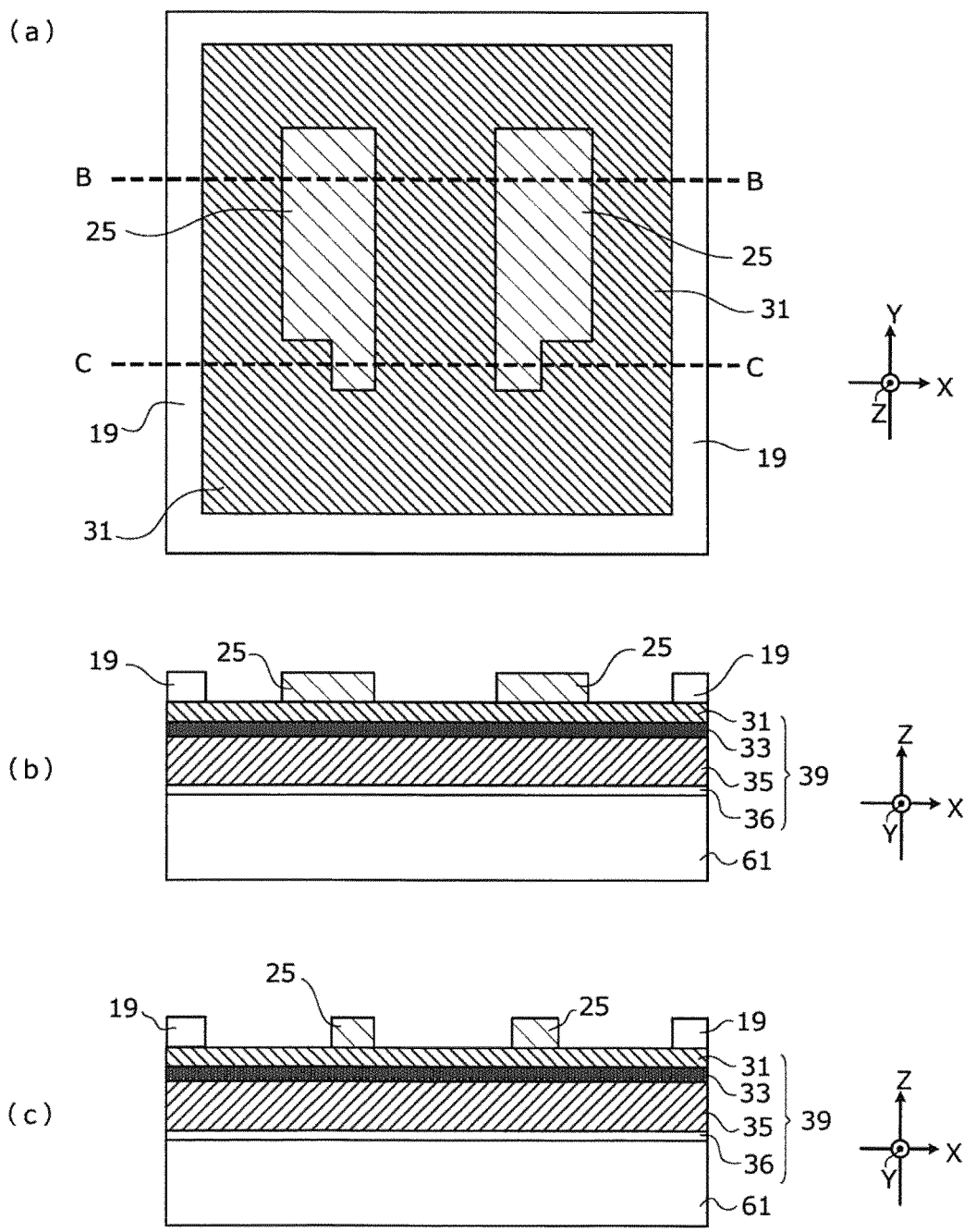

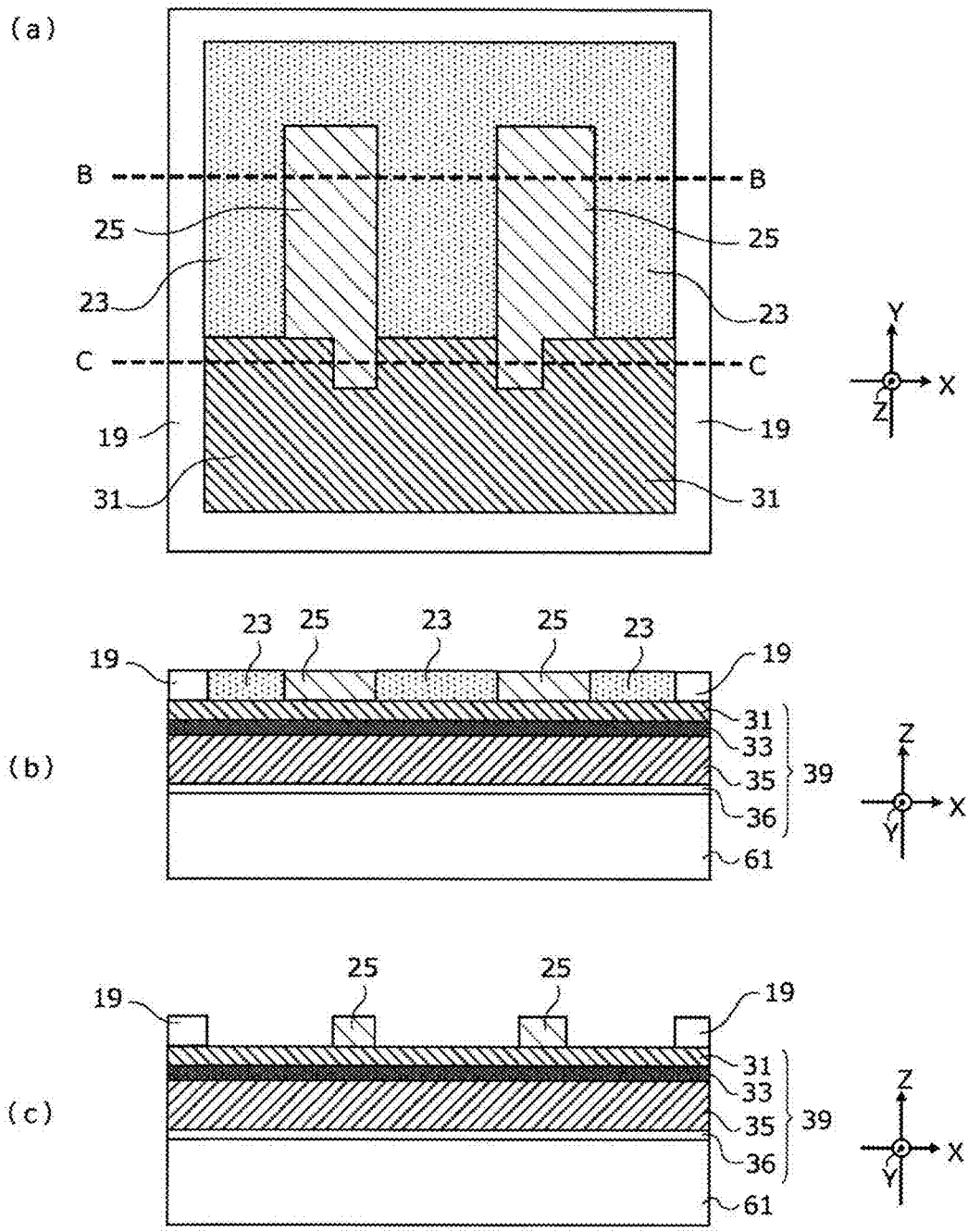

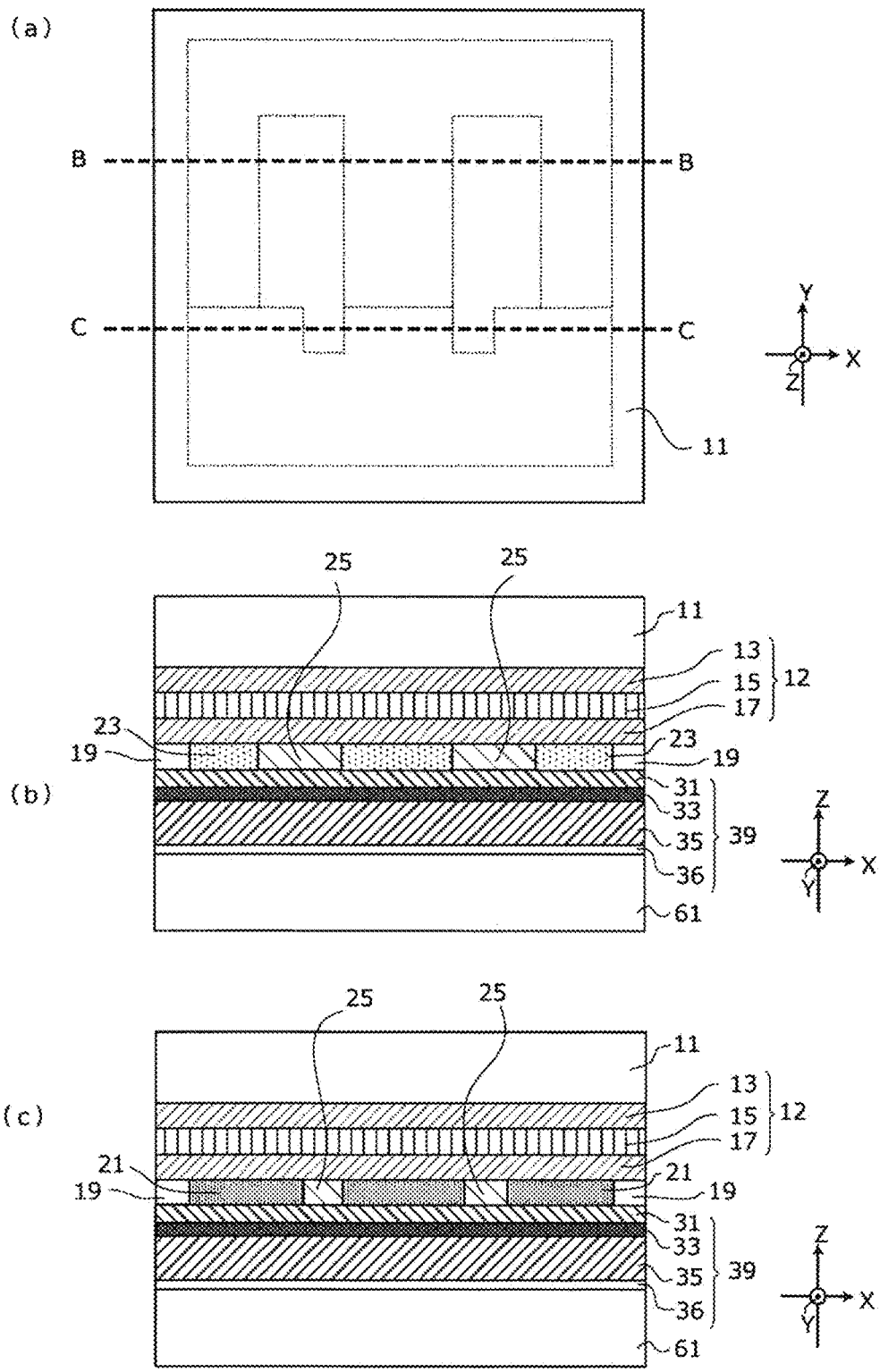

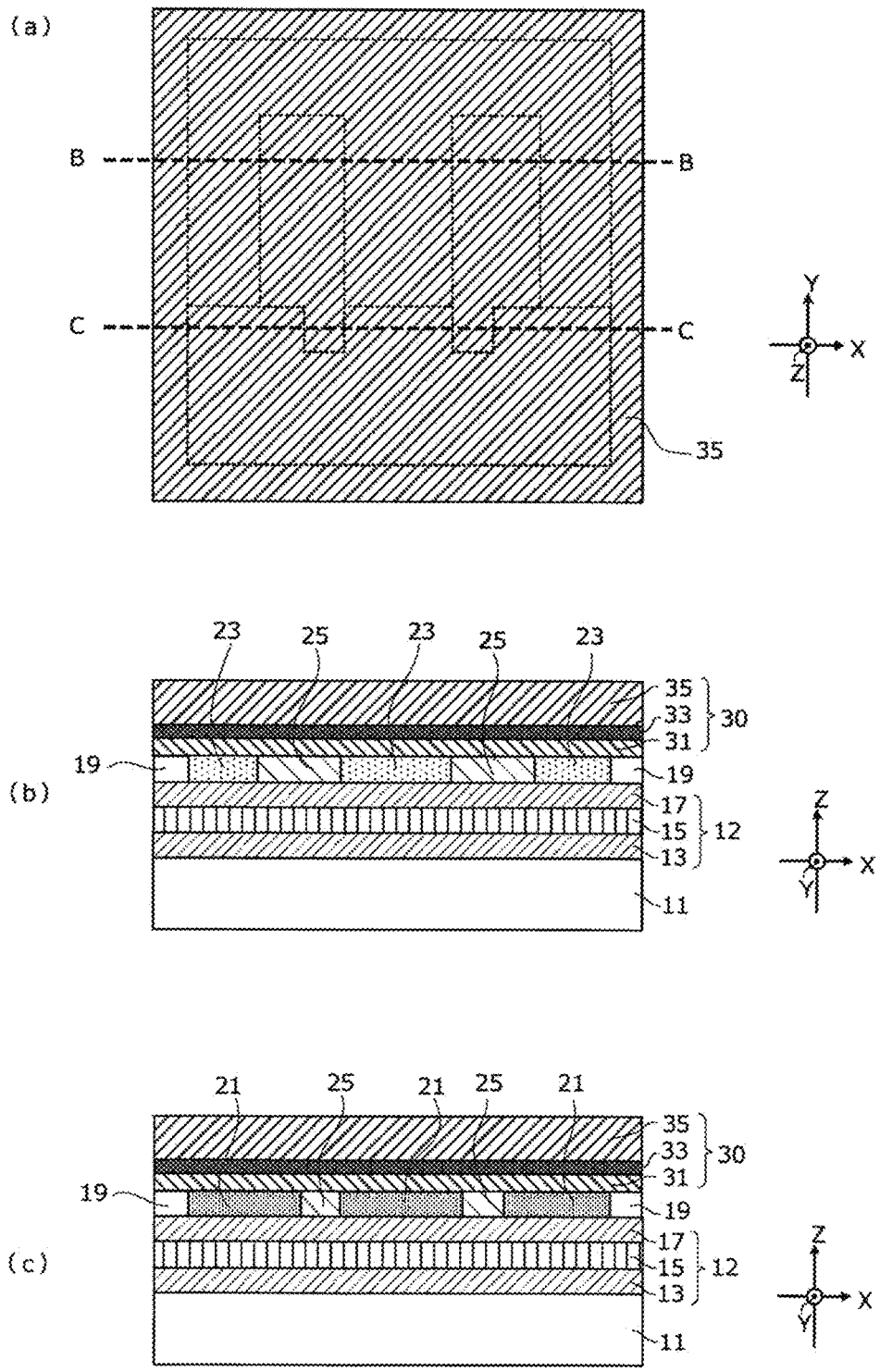

Fig.3
(a)
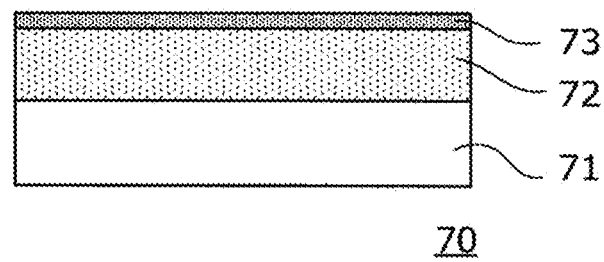
(b)
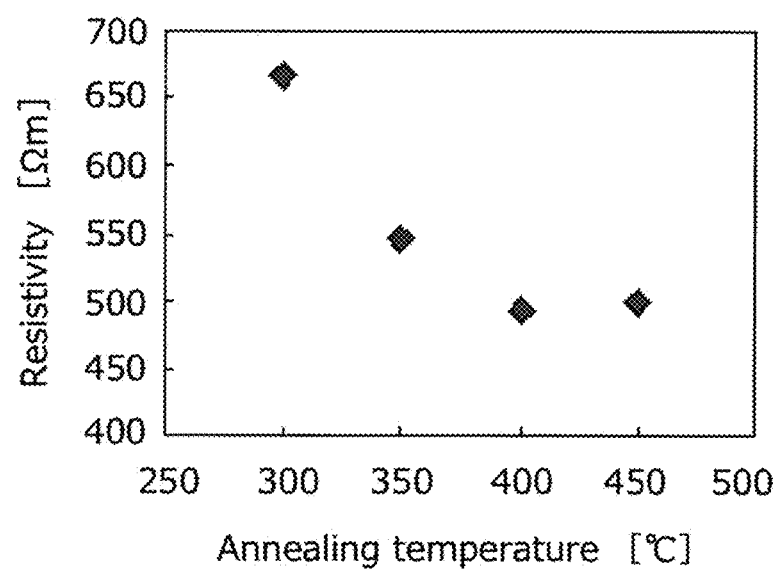

Fig.4
(a)
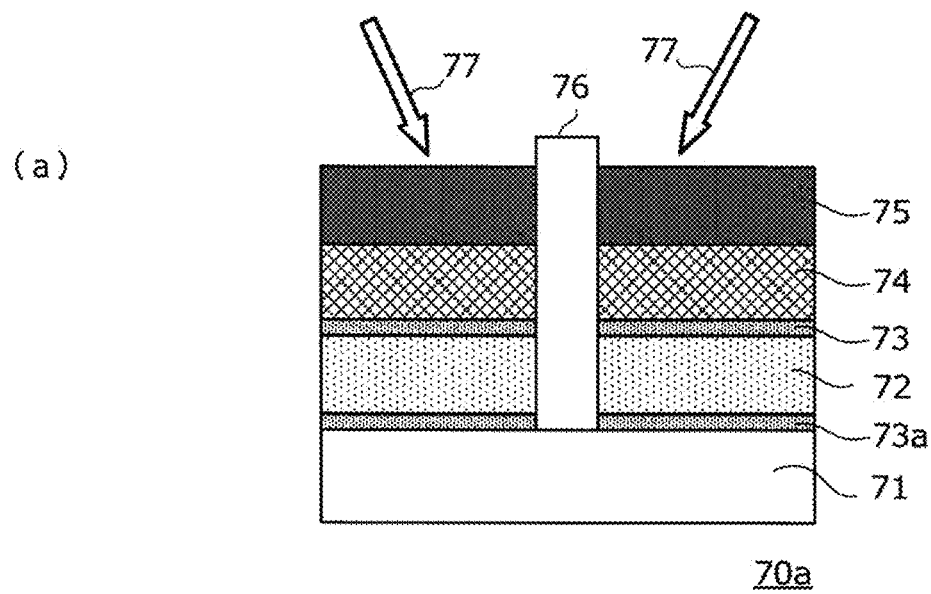
70a
(b)
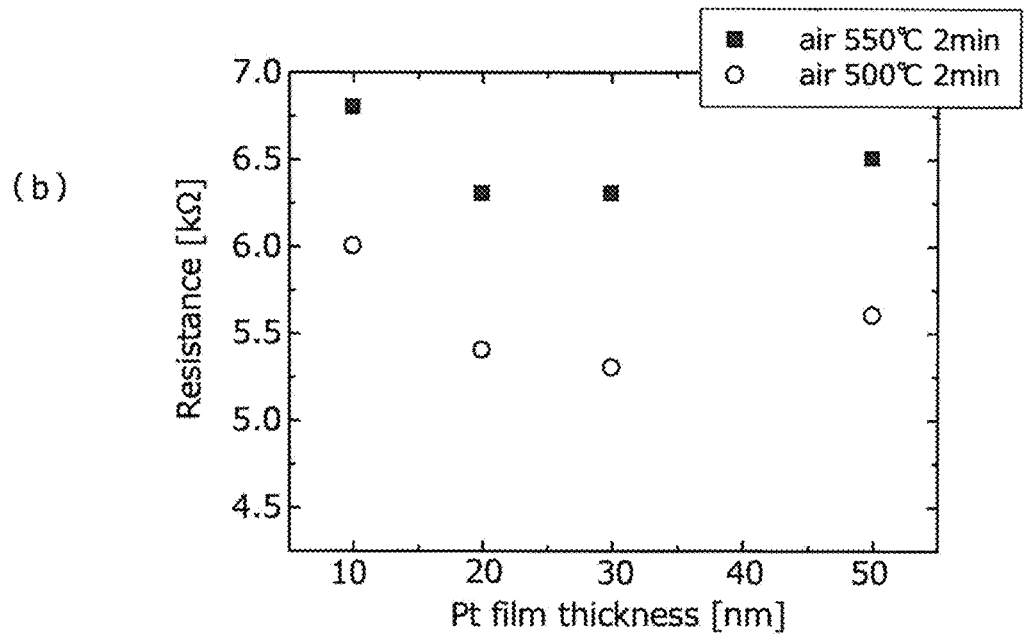

Fig.6
(a) 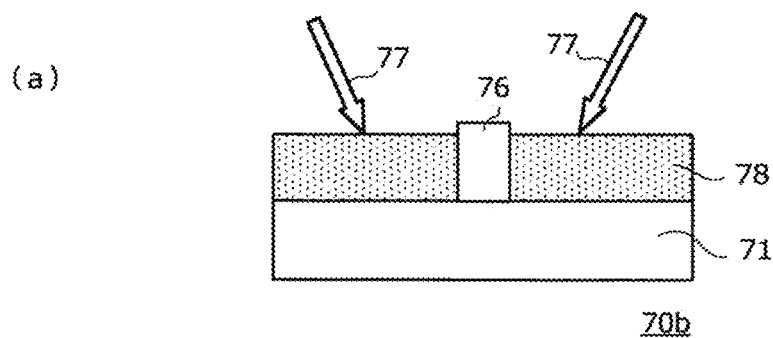
(b) 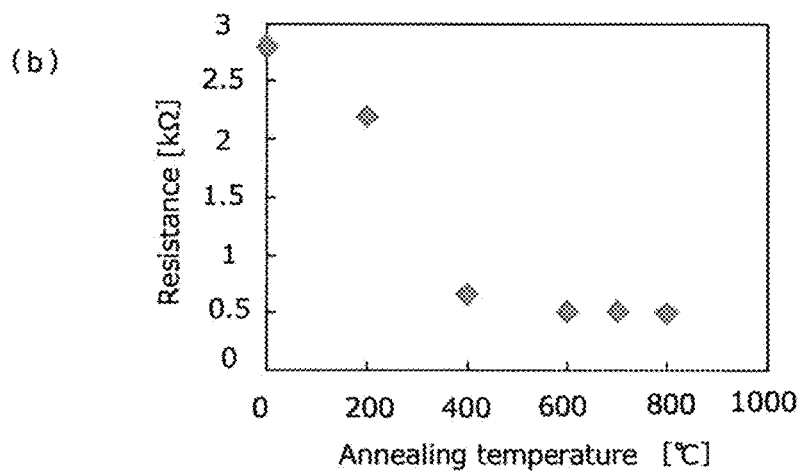
(c) 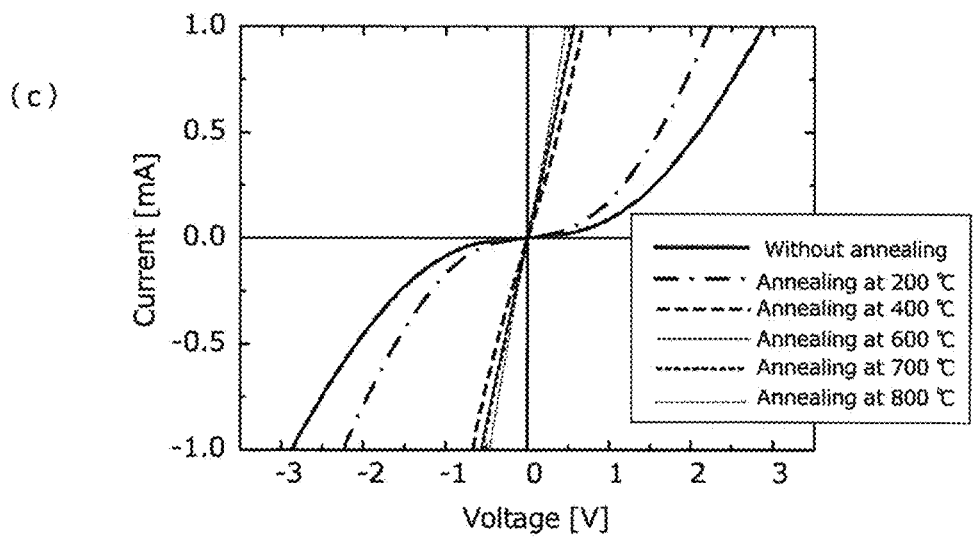

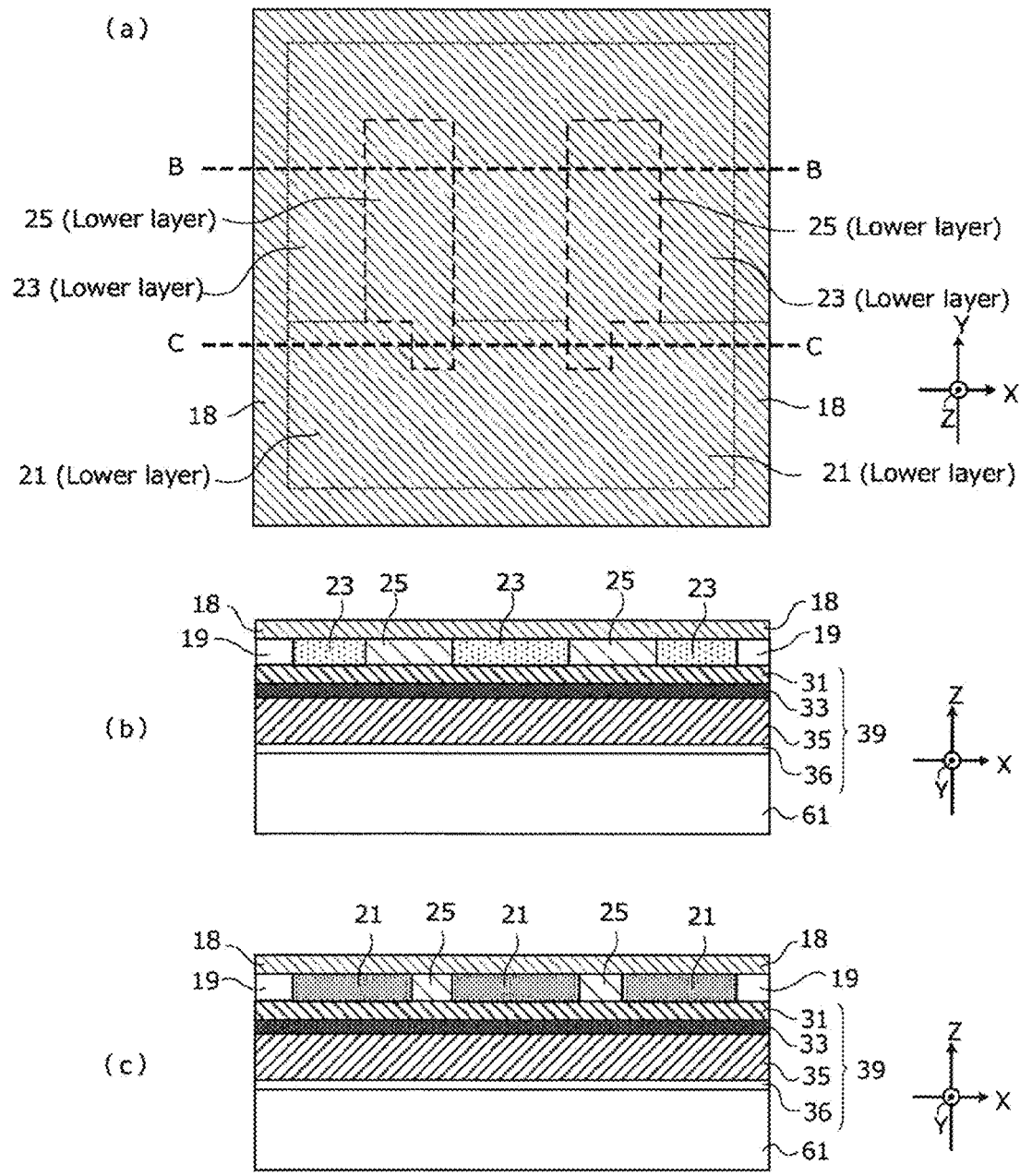

Fig.7B
(a)
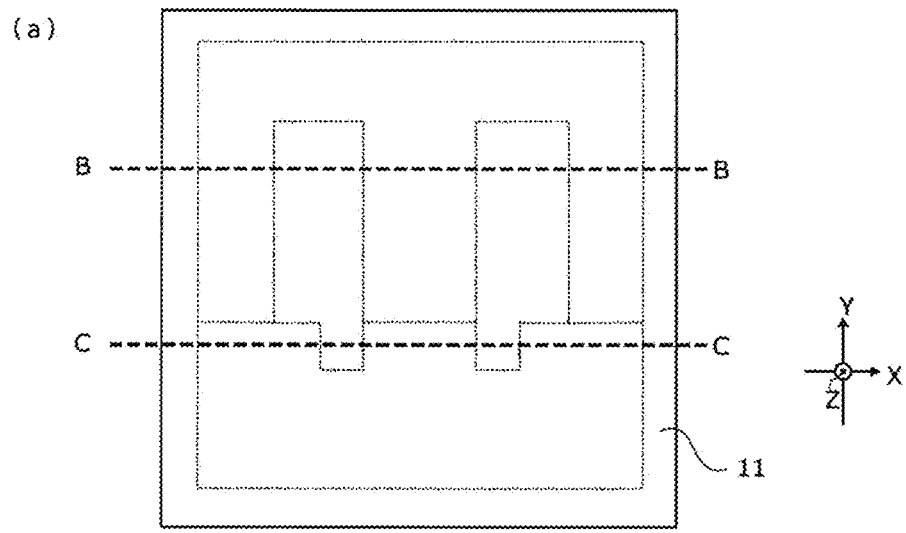
(b)
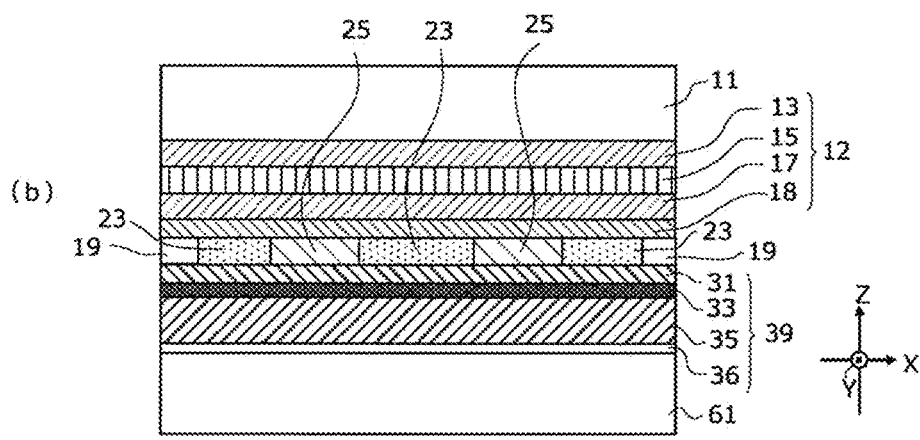
(c)
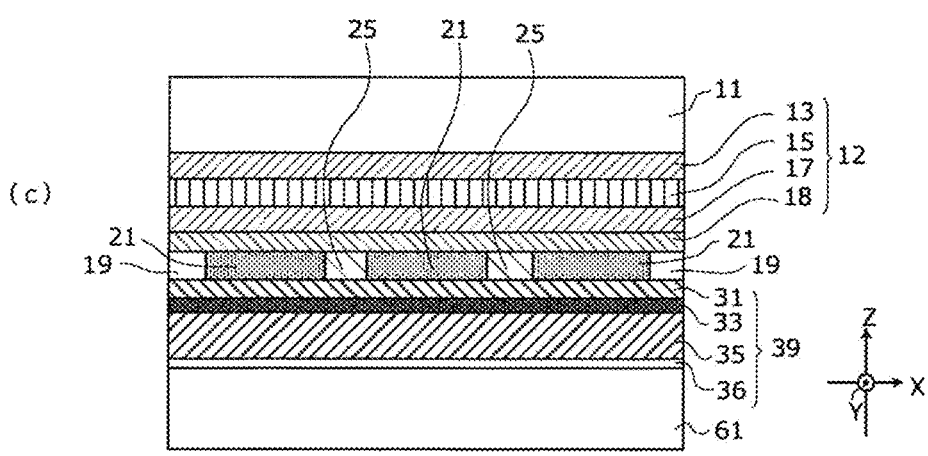

Fig.7C
(a)
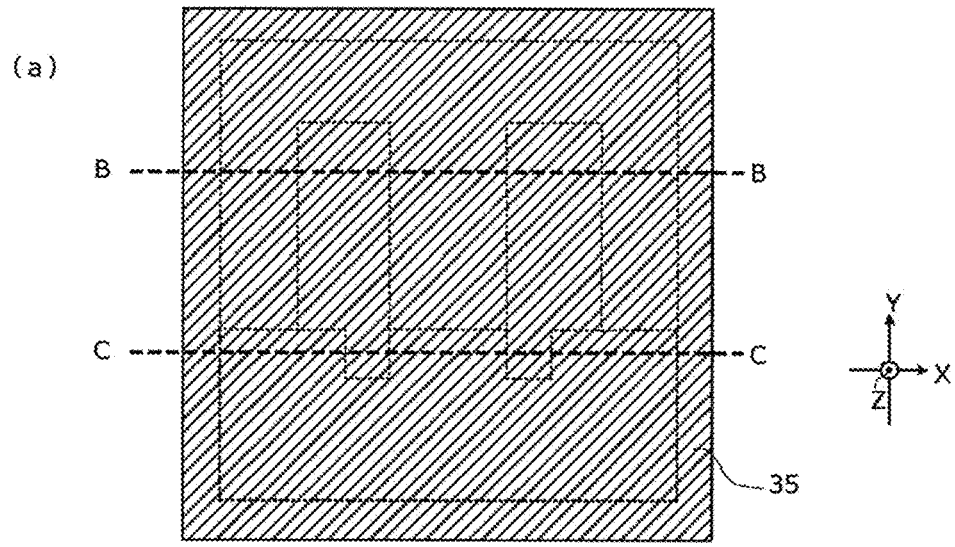
(b)
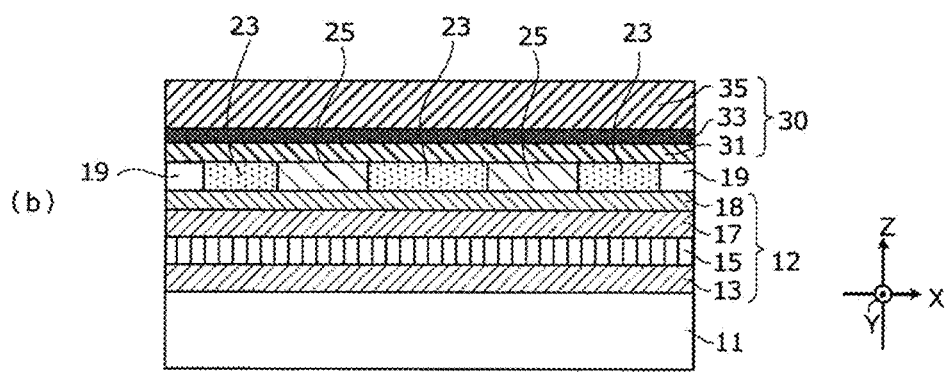
(c)
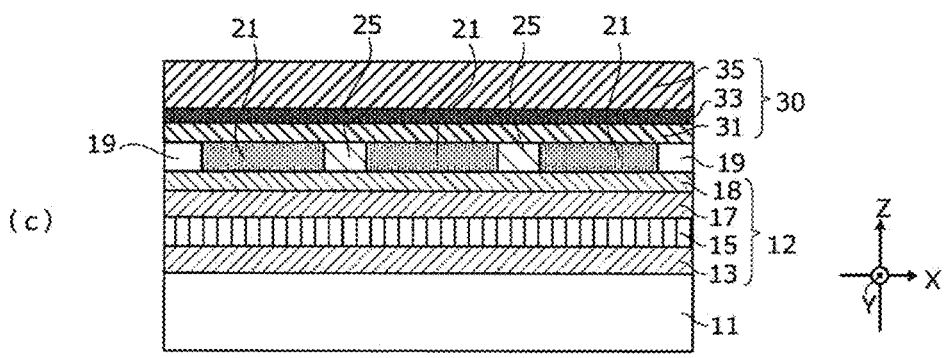

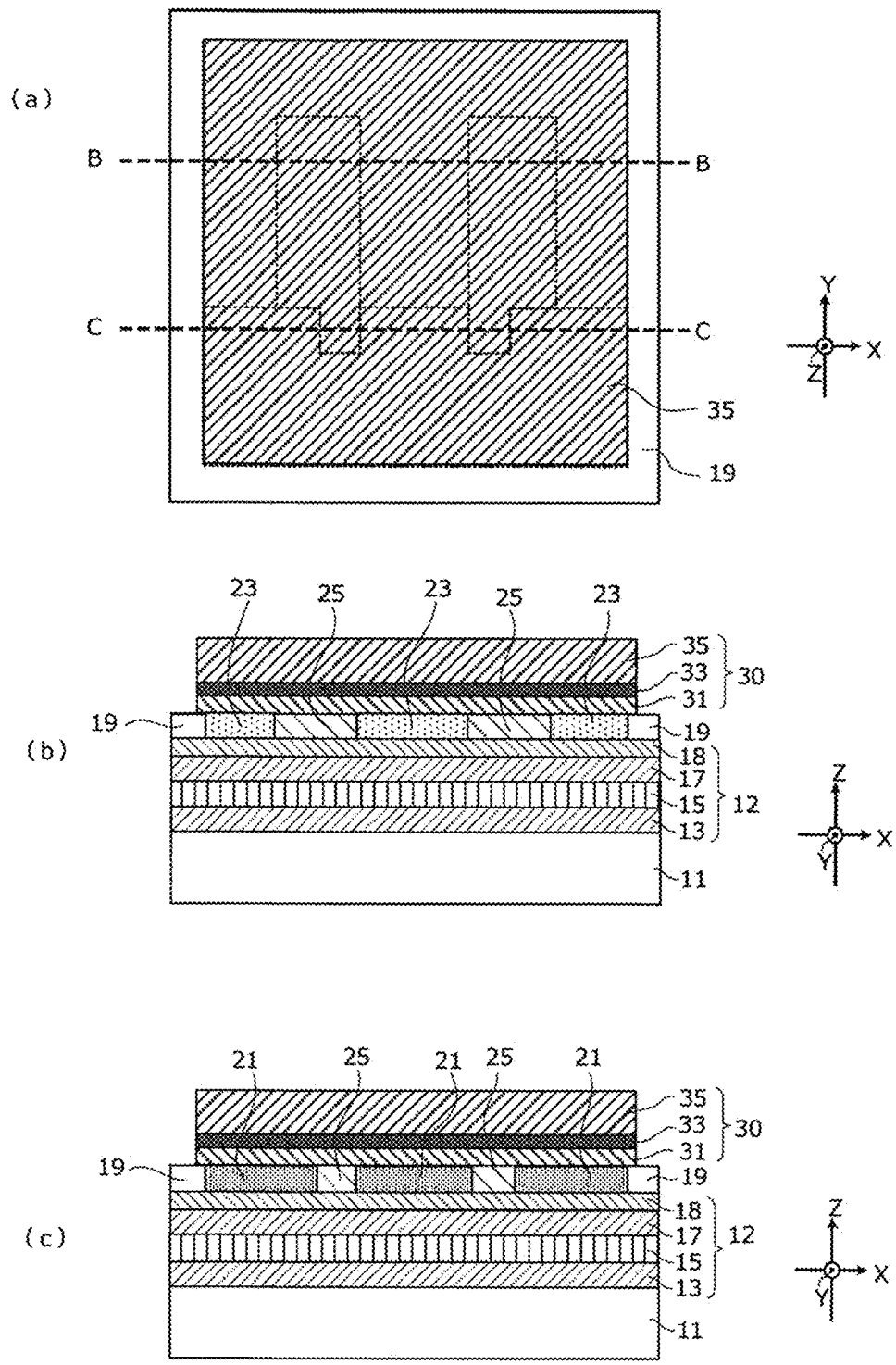

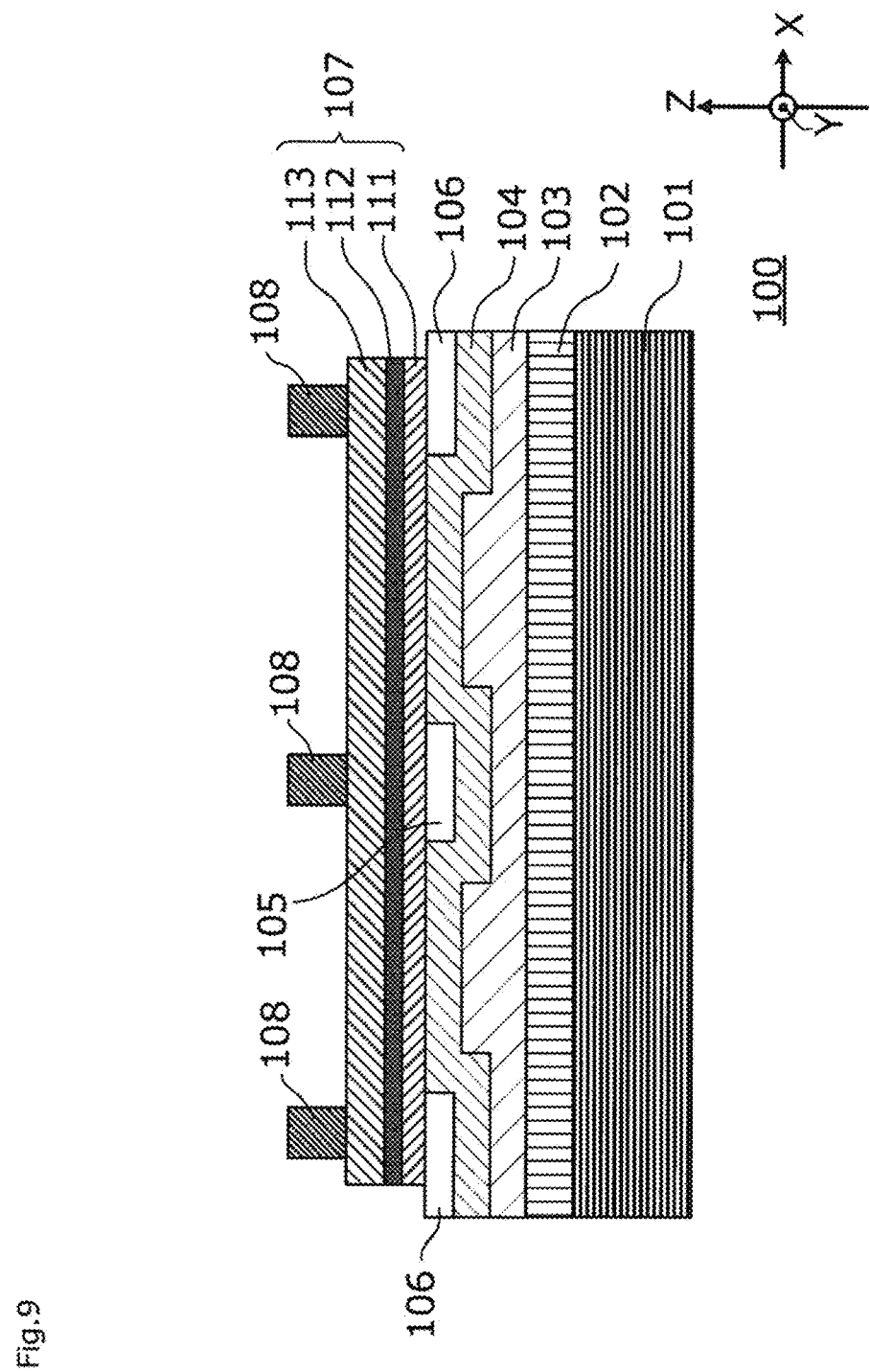

SEMICONDUCTOR LIGHT-EMITTING ELEMENT AND METHOD FOR PRODUCING THE SAME

BACKGROUND OF THE INVENTION

1. Field of the Invention

The present invention relates to a semiconductor light-emitting element that includes a substrate and a semiconductor layer provided over the substrate and including a p-type semiconductor layer, a light-emitting layer, and an n-type semiconductor layer. The present invention relates also to a method for producing such a semiconductor light-emitting element.

2. Description of the Related Art

Patent Document 1 discloses a structure shown in FIG. 9 as one example of a conventional semiconductor light-emitting element.

FIG. 9 is a schematic sectional view of the semiconductor light-emitting element disclosed in Patent Document 1. A conventional semiconductor light-emitting element 100 has a structure in which a bonding layer 102, a reflective electrode 103, an ohmic contact layer 104, a current blocking layer 105, an isolation layer 106, a semiconductor layer 107, and an n-side electrode 108 are provided on a support substrate 101. The semiconductor layer 107 includes a p-type semiconductor layer 111, a light-emitting layer 112, and an n-type semiconductor layer 113 that are stacked in this order from the bottom.

In the following description, a plane parallel to the substrate surface of the support substrate 101 is defined as an X-Y plane, and a direction perpendicular to the plane is defined as a Z direction. It is to be noted that the semiconductor light-emitting element 100 shown in FIG. 9 is an element from which light is extracted in an upward direction (Z direction) in the plane of paper.

The bonding layer 102 is a conductive material that is provided to improve adhesion between the support substrate 101 and the reflective electrode 103 when they are bonded together. The bonding layer 102 is made of, for example, solder. The reflective electrode 103 is made of a metal or alloy having a high reflectivity. The reflective electrode 103 reflects light emitted from the light-emitting layer 112 toward the support substrate 101 side (in a downward direction in the plane of paper) so that the light is guided to a light extraction surface provided on the n-side electrode 108 side. This is effective at improving light extraction efficiency.

The current blocking layer 105 is provided in a position vertically below the n-side electrode 108 so as to be in contact with the bottom surface of the semiconductor layer 107. The current blocking layer 105 is made of an insulating material or a material that forms a Schottky contact with the semiconductor layer 107. According to Patent Document 1, the current blocking layer 105 shall contain at least one selected from, for example, $SiO_2$, $SiO_x$, $SiO_xN_y$, $Si_3N_4$, $Al_2O_2$, $TiO_x$, Ti, Al, and Cr.

The isolation layer 106 is an insulating layer provided for the purpose of ensuring insulation between adjacent elements when the semiconductor layer 107 is separated for element isolation. The isolation layer 106 is made of, for example, $SiO_2$, SiN, or $Al_2O_2$.

The ohmic contact layer 104 is constituted from a conductive oxide film, such as ITO, having light permeability. The ohmic contact layer 104 is provided on the upper surface of the reflective electrode 103, and part of the upper surface of the ohmic contact layer 104 is in contact with the bottom surface of the semiconductor layer 107. More specifically, the ohmic contact layer 104 is in contact with the isolation layer 106 or the current blocking layer 105 without any contact with the semiconductor layer 107 in a position vertically below the n-side electrode 108, and is in contact with the semiconductor layer 107 in part of a region where the n-side electrode 108 is not provided vertically above the ohmic contact layer 104. The ohmic contact layer 104 forms an ohmic contact with the semiconductor layer 107 at its interface with the semiconductor layer 107.

PRIOR ART DOCUMENT

Patent Document

Patent Document 1: JP-A-2012-244158

BRIEF SUMMARY OF THE INVENTION

As shown in FIG. 9, in the semiconductor light-emitting element 100, the current blocking layer 105 or the isolation layer 106 having a higher resistance than the reflective electrode 103 or the ohmic contact layer 104 is brought into contact with the bottom surface of the semiconductor layer 107 in a region vertically below the n-side electrode 108. This makes it possible to reduce the concentrated flow of electric current in a vertical direction (Z direction) in a region of the semiconductor layer 107 located vertically below the n-side electrode 108, thereby spreading electric current, flowing through the light-emitting layer 112, in a horizontal direction (direction parallel to the X-Y plane). This is effective at allowing light to be emitted from a wider region of the light-emitting layer 112 to increase light output.

In recent years, semiconductor light-emitting elements have come to be required to produce a higher light output than conventional semiconductor light-emitting elements. Therefore, there is a demand for an element that stably emits high-power light even when high electric current is supplied.

The present inventors have intensively studied, and as a result have found that when high electric current is injected to the conventional semiconductor light-emitting element, electric current concentrates near a place on the n-side electrode 108 to which a current supply line (e.g., bonding wire) is connected (hereinafter, referred to as a "current supply part") so that the temperature near the current supply part is increased. Further, the present inventors have also found that when such injection of high electric current is continued for a certain period of time, the n-type semiconductor layer 113 provided near the current supply part is degraded, cracked, or melted so that the lifetime of the element is shortened. This problem has been found in the intensive study made by the present inventors.

FIG. 10 is a schematic top view of the conventional semiconductor light-emitting element 100 shown in FIG. 9. FIG. 11 is a photograph of top view of an element having a structure shown in FIG. 10. It is to be noted that FIG. 9 is a schematic sectional view taken along the A-A line (line parallel to the X direction) in FIG. 10.

As shown in FIG. 10, a current supply part 109 corresponds to part of a region where the n-side electrode 108 is provided. It is to be noted that FIG. 10 shows a case where the current supply part 109 is arranged on one side in the Y direction. Further, when the semiconductor light-emitting element 100 is viewed from above, the ohmic contact layer 104 provided under the semiconductor layer 107 is hidden by the semiconductor layer 107 and is therefore not visible, but is indicated by a dotted line in FIG. 10 for ease of comprehension.

FIG. 12 is a photograph showing a temperature distribution in the top surface of the semiconductor light-emitting element 100 when an electric current of 500 mA or 1000 mA is supplied to the current supply part 109. As shown in FIG. 12(*a*), when an electric current of about 500 mA is supplied, there is no significant difference in temperature between a region near the current supply part 109 and the other place. However, as shown in FIG. 12(*b*), when a high electric current of 1000 mA is supplied, a region near the current supply part 109 appears whitish, which indicates that this region has a very high temperature. That is, FIG. 12(*b*) indicates that there is a significant difference in temperature between a region near the current supply part 109 and a place far from the current supply part 109 in the Y direction.

FIG. 13 is a graph showing the distribution of light output according to the position on the element in the Y direction, more specifically, the distribution of a value obtained by integrating light output at the same Y coordinate in the X direction. In FIG. 13, the horizontal axis represents the amount of displacement from the center of the element as a reference position in the Y+ and Y− directions, and the vertical axis represents the relative value of light output. When a high electric current of 1000 mA is supplied, the light output in a place far from the current supply part 109 is about 70% of that in a region near the current supply part 109. This suggests that high electric current concentrates near the current supply part 109.

FIG. 14 is a scanning electron micrograph of top surface of the conventional semiconductor light-emitting element 100, which was taken after a high electric current of 1000 mA was supplied from the current supply part 109 for 20 hours. As shown in FIG. 14, cracking 117 and melting 118 are observed in the n-type semiconductor layer 113.

In view of the above problem, it is an object of the present invention to achieve a semiconductor light-emitting element capable of preventing concentration of electric current in a region near a current supply part even when high electric current is supplied.

In order to achieve the above object, the present invention is directed to a semiconductor light-emitting element including:

a substrate;

a semiconductor layer that is provided over the substrate and includes a p-type semiconductor layer, a light-emitting layer, and an n-type semiconductor layer;

a first electrode that is provided in contact with part of an upper surface of the semiconductor layer and includes a current supply part connected to a current supply line;

a second electrode that is provided in part of a region vertically below a region where the current supply part is not provided, that is in contact with part of a bottom surface of the semiconductor layer, and that is made of a material that reflects light emitted from the light-emitting layer; and a first current blocking layer that is provided in a region including a region vertically below the current supply part and that is in contact with part of the bottom surface of the semiconductor layer, wherein a contact resistance at an interface between the first current blocking layer and the semiconductor layer is higher than that at an interface between the second electrode and the semiconductor layer.

In the case of the above structure, the first current blocking layer that is in contact with the semiconductor layer vertically below the current supply part constituting part of the first electrode is formed to have a higher contact resistance with the semiconductor layer than the second electrode that is in contact with the semiconductor layer vertically below a region where the current supply part is not provided. Therefore, electric current supplied to the current supply part less easily flows toward a region where the first current blocking layer having a high contact resistance is provided, that is, toward a region vertically below the current supply part or the vicinity of the region, but easily flows toward a region where the second electrode having a low contact resistance is provided. As a result, the electric current supplied to the current supply part easily flows through the semiconductor layer in a direction parallel to the surface of the substrate.

The present inventors have intensively studied and found the above facts based on the finding that electric current easily concentrates particularly near the current supply part constituting part of the first electrode during driving. Concentration of electric current near the current supply part is prevented particularly by providing the first current blocking layer having a high resistance in a region including a region vertically below the current supply part. As a result, an increase in the temperature near the current supply part is relieved, and therefore a longer life of the element can be achieved even when high electric current is supplied.

Here, the second electrode shall be provided in at least part of a region vertically below a region where the current supply part is not provided, and part of the second electrode may be located vertically below the first electrode.

The semiconductor light-emitting element may include a second current blocking layer that is provided in a region including a region vertically below a region where the first electrode is provided, that is located in a position farther from the current supply part than a place, in which the first current blocking layer is provided, in a direction parallel to a surface of the substrate, and that is in contact with part of the bottom surface of the semiconductor layer, wherein a contact resistance at an interface between the second current blocking layer and the semiconductor layer is higher than that at an interface between the second electrode and the semiconductor layer and is lower than that at an interface between the first current blocking layer and the semiconductor layer.

In the case of the above structure, the first current blocking layer is provided in a region vertically below the current supply part provided in a region where the first electrode is provided, and the second current blocking layer is provided in a place far from the current supply part in a region vertically below a region where the first electrode is provided. The second current blocking layer is formed to have a higher contact resistance with the semiconductor layer than the second electrode and a lower contact resistance with the semiconductor layer than the first current blocking layer. That is, a layer having a higher resistance than the second electrode is in contact with the semiconductor layer in a region vertically below the first electrode, and therefore electric current less easily flows from the first electrode in the vertical direction. This is effective at spreading electric current in the horizontal direction. Further, the contact resistance with the semiconductor layer is set to be lower in a place far from the current supply part than in a region near the current supply part, and therefore electric current supplied from the current supply part easily flows toward the place far from the current supply part. This makes it possible to prevent concentration of electric current near the current supply part, and is effective at further spreading electric current, flowing through the semiconductor layer, in the horizontal direction. That is, light extraction efficiency can be improved while a longer life of the element can be achieved even when high electric current is supplied from the current supply part.

The semiconductor light-emitting element may have a conductive layer provided over the substrate, wherein a bottom surface of the second electrode, a bottom surface of the first current blocking layer, and a bottom surface of the second current blocking layer are in contact with an upper surface of the conductive layer.

Further, in the semiconductor light-emitting element, the first current blocking layer and the second current blocking layer may be made of a material that reflects light emitted from the light-emitting layer. More specifically, the first current blocking layer and the second current blocking layer may be made of a metal material containing Ag, Al, Ni, Ti, or Pt.

In the case of the above structure, light emitted from the light-emitting layer toward the substrate side can be reflected not only by the second electrode but also by a place where the first current blocking layer and the second current blocking layer are provided toward the light extraction surface side, that is, toward the first electrode side. This makes it possible to further improve light extraction efficiency.

Further, in the semiconductor light-emitting element, the conductive layer may include a reflective layer of which an uppermost layer is made of a material that reflects light emitted from the light-emitting layer, wherein the first current blocking layer and the second current blocking layer are made of a material that transmits light emitted from the light-emitting layer. In this case, more specifically, the first current blocking layer and the second current blocking layer may be made of, for example, a material containing ITO.

In the case of the above structure, light emitted from the light-emitting layer toward the substrate side is reflected by the second electrode in a place where the second electrode that is in contact with the semiconductor layer is provided, but in a place where the first current blocking layer and the second current blocking layer that are in contact with the semiconductor layer are provided, passes through the first current blocking layer or the second current blocking layer and is then reflected by the reflective layer provided under the first current blocking layer and the second current blocking layer. This makes it possible to change the direction of the light so that the light travels toward the light extraction surface side, that is, toward the first electrode side. Therefore, also in the case of this structure, light extraction efficiency can be further improved.

Further, when a width of the current supply part and a width of the first current blocking layer in a direction parallel to the surface of the substrate are defined as d and D, respectively, the semiconductor light-emitting element may have a structure satisfying a relationship represented by $1.1d \leq D \leq 3d$.

The above structure can maximize the effect of relieving concentration of electric current near the current supply part.

The present invention is directed also to a method for producing a semiconductor light-emitting element having the above-described structure, the method including:

a step (a) in which the semiconductor layer is formed on a substrate;

a step (b1) in which a material film for forming the second electrode is formed in a predetermined region on a first surface of the semiconductor layer, and then contact annealing treatment is performed to form the second electrode;

a step (b2) in which, after the step (b1) is performed, a material film for forming the first current blocking layer is formed on the first surface of the semiconductor layer in a predetermined region where the second electrode is not provided, and then contact annealing treatment is performed at a temperature lower than that used in the step (b1) to form the first current blocking layer;

a step (c) in which, after the step (b2) is performed, the first electrode is formed on a second surface of the semiconductor layer that is on a side opposite to the first surface; and a step (d) in which the current supply part connected to the current supply line is formed on the first electrode in part of a region opposed to the first current blocking layer in a direction perpendicular to a surface of the substrate.

When contact annealing treatment is performed at an annealing temperature lower than that used when an ohmic contact is formed, the contact resistance with the semiconductor layer can be made higher than that of the ohmic contact. Therefore, according to the above method, the first current blocking layer having a higher contact resistance with the semiconductor layer than the second electrode is formed by performing contact annealing treatment in the step (b2) at an annealing temperature lower than that used in the step (b1) of forming the second electrode. Further, after the first electrode is formed in the step (c), in the step (d), the current supply part connected to the current supply line is formed in part of a region where the first electrode is provided and which is opposed to the first current blocking layer in a direction perpendicular to the surface of the substrate. In this way, the first current blocking layer is formed vertically below the current supply part. This makes it possible to produce the semiconductor light-emitting element capable of relieving concentration of electric current at the current supply part.

The above production method may further include a step (b3) in which, after the step (a) and the step (b1) are performed, a material film for forming the second current blocking layer is formed on the first surface of the semiconductor layer in a predetermined region where the second electrode is not provided, and then contact annealing treatment is performed at a temperature lower than that used in the step (b1) but higher than that used in the step (b2) to form the second current blocking layer, wherein the step (b2) is a step in which, after the step (b3) is performed, a material film for forming the first current blocking layer is formed on the first surface of the semiconductor layer in a place where the second electrode and the second current blocking layer are not provided, and then contact annealing treatment is performed at a temperature lower than those used in the step (b1) and the step (b3) to form the first current blocking layer.

As described above, the contact resistance with the semiconductor layer can be controlled by the annealing temperature at which contact annealing treatment is performed. Therefore, the second current blocking layer having a contact resistance with the semiconductor layer higher than that of the second electrode but lower than that of the first current blocking layer is formed in the step (b3) by performing contact annealing treatment at an annealing temperature lower than that used in the step (b1) in which the second electrode is formed but higher than that used in the step (b2). Then, in the step (b2), the first current blocking layer is formed by performing contact annealing treatment at a temperature lower than those used in the step (b1) and the step (b3). Then, the current supply part is formed in a position opposed to the first current blocking layer in a direction perpendicular to the surface of the substrate through the steps (c) and (d).

That is, according to the above method, in a region located vertically below the first electrode, the first current blocking layer having a high contact resistance is in contact with the semiconductor layer near the current supply part, and the second current blocking layer having a lower contact resistance than the first current blocking layer is in contact with the semiconductor layer in a position far from the current supply part. Further, the second electrode having a lower contact resistance than the first current blocking layer and the second current blocking layer is in contact with the semiconductor layer vertically below a region where the first electrode is not provided.

Therefore, electric current less easily flows from the first electrode in the vertical direction and therefore effectively spreads in the horizontal direction because a layer having a higher resistance than the second electrode is in contact with the semiconductor layer in a region vertically below the first electrode. Further, the contact resistance with the semiconductor layer is set to be lower in a place far from the current supply part than in a region near the current supply part, and therefore electric current supplied from the current supply part easily flows toward the place far from the current supply part. This makes it possible to achieve the semiconductor light-emitting element capable of preventing concentration of electric current near the current supply part and more effectively spreading electric current, flowing through the semiconductor layer, in the horizontal direction.

In the above method, the material films formed in the steps (b1), (b2), and (b3) may be made of the same metal material. In this case, the current blocking layers as well as the second electrode can have reflective function.

The above production method may further include, when the material film formed in the step (b1) is made of a metal material and the material films formed in the step (b2) and the step (b3) are made of ITO, a step (b4) in which, after the step (b2) is performed, a metal material film is formed to extend across the second electrode, the first current blocking layer, and the second current blocking layer, and then contact annealing treatment is performed at a temperature equal to or lower than that used in the step (b2) to form a reflective layer, wherein the step (c) is performed after the step (b4) is performed.

As described above, when contact annealing treatment is performed at an annealing temperature lower than that used when an ohmic contact is formed, the contact resistance with the semiconductor layer can be made higher than that of the ohmic contact. This applies not only to a metal material but also to ITO.

Therefore, also in the case of the above method, in a region located vertically below the first electrode, the first current blocking layer having a high contact resistance is in contact with the semiconductor layer near the current supply part, and the second current blocking layer having a lower contact resistance than the first current blocking layer is in contact with the semiconductor layer in a position far from the current supply part. Therefore, the contact resistance with the semiconductor layer is set to be lower in a place far from the current supply part than in a region near the current supply part, and therefore electric current supplied from the current supply part easily flows toward the place far from the current supply part.

Further, according to the above method, a reflective layer may be provided under the first current blocking layer and the second current blocking layer. In this case, even when the first current blocking layer and the second current blocking layer are made of light-permeable ITO, light emitted from the light-emitting layer toward the substrate side passes through the first current blocking layer or the second current blocking layer in a place where the first current blocking layer and the second current blocking layer that are in contact with the semiconductor layer are provided, and is then reflected by the reflective layer provided under the first current blocking layer and the second current blocking layer. This makes it possible to produce the semiconductor light-emitting element having improved light extraction efficiency and capable of relieving concentration of electric current near the current supply part.

The present invention is directed also to a method for producing a semiconductor light-emitting element having the above-described structure, the method including:

a step (a) in which the semiconductor layer is formed on a substrate;

a step (b1) in which a material film having a multi-layered structure including an uppermost Pt layer is formed in a predetermined region on a first surface of the semiconductor layer, and then contact annealing treatment is performed to form the second electrode;

a step (b2) in which, after the step (b1) is performed, the material film having a multi-layered structure including an uppermost Pt layer having a smaller film thickness than that in the step (b1) is formed on the first surface of the semiconductor layer in a place where the second electrode is not provided, and then contact annealing treatment is performed to form the first current blocking layer;

a step (c) in which, after the step (b2) is performed, the first electrode is formed on a second surface of the semiconductor layer that is on a side opposite to the first surface; and a step (d) in which the current supply part connected to the current supply line is formed on the first electrode in part of a region opposed to the first current blocking layer in a direction perpendicular to a surface of the substrate.

As a result of an intensive study made by the present inventors, it has been found that when a metal material film, including an uppermost Pt layer having a film thickness smaller than that at the time when an ohmic contact is formed, is formed and then contact annealing treatment is performed, the contact resistance with the semiconductor layer can be made higher than that of the ohmic contact. Therefore, according to the above method, the first current blocking layer having a higher contact resistance with the semiconductor layer than the second electrode can be formed in the step (b2) by forming a material film including a Pt film having a film thickness smaller than that in the step (b1) in which the second electrode is formed and then by performing contact annealing treatment. Then, after the first electrode is formed in the step (c), in the step (d), the current supply part connected to the current supply line is formed in part of a region where the first electrode is provided and which is opposed to the first current blocking layer in a direction perpendicular to the surface of the substrate. In this way, the first current blocking layer is formed vertically below the current supply part. This makes it possible to produce the semiconductor light-emitting element capable of relieving concentration of electric current at the current supply part.

The above production method may further include a step (b3) in which, after the step (a) and the step (b1) are performed, the material film whose Pt layer has a smaller film thickness than that in the step (b1) but has a larger film thickness than that in the step (b2) is formed on the first surface of the semiconductor layer in a predetermined region where the second electrode is not provided, and then contact annealing treatment is performed to form the second current blocking layer, wherein the step (b2) is a step in which, after the step (b3) is performed, the material film whose Pt layer has a smaller film thickness than those in the step (b1) and the step (b3) is formed on the first surface of the semiconductor layer in a place where the second electrode and the second current blocking layer are not provided, and then contact annealing treatment is performed to form the first current blocking layer.

As described above, the contact resistance between the metal material film and the semiconductor layer that are to be subjected to contact annealing can be controlled by controlling the film thickness of the uppermost Pt layer. Therefore, the second current blocking layer having a contact resistance with the semiconductor layer higher than the second electrode but lower than the first current blocking layer is formed in the step (b3) by forming a material film including an uppermost Pt layer whose film thickness is smaller than that in the step (b1) in which the second electrode is formed but larger than that in the step (b2) and then by performing contact annealing treatment. Then, the first current blocking layer is formed in the step (b2) by forming a metal material film including an uppermost Pt layer whose film thickness is smaller than those in the step (b1) and the step (b3) and then by performing contact annealing treatment. Then, the current supply part is formed in a position opposed to the first current blocking layer in a direction perpendicular to the surface of the substrate through the steps (c) and (d).

Therefore, also in the case of the above method, in a region located vertically below the first electrode, the first current blocking layer having a high contact resistance is in contact with the semiconductor layer near the current supply part, and the second current blocking layer having a lower contact resistance than the first current blocking layer is in contact with the semiconductor layer in a position far from the current supply part. Further, the second electrode having a lower contact resistance than the first current blocking layer and the second current blocking layer is in contact with the semiconductor layer vertically below a region where the first electrode is not provided. This makes it possible to achieve the semiconductor light-emitting element capable of preventing concentration of electric current near the current supply part and more effectively spreading electric current, flowing through the semiconductor layer, in the horizontal direction.

The semiconductor light-emitting element according to the present invention can provide a high-power device that is capable of relieving concentration of electric current near the current supply part and therefore of achieving a longer life. Further, the semiconductor light-emitting element production method according to the present invention can produce such a high-power device.

BRIEF DESCRIPTION OF THE SEVERAL VIEWS OF THE DRAWINGS

FIG. 1A is a schematic top view of a semiconductor light-emitting element according to a first embodiment of the present invention;

FIG. 2A is part of a production process diagram of the first embodiment of the semiconductor light-emitting element;

FIG. 2B is part of a production process diagram of the first embodiment of the semiconductor light-emitting element;

FIG. 2C is part of a production process diagram of the first embodiment of the semiconductor light-emitting element;

FIG. 2E is part of a schematic process diagram of the first embodiment of the semiconductor light-emitting element;

FIG. 2F is part of a schematic process diagram of the first embodiment of the semiconductor light-emitting element;

FIG. 3 is a diagram for explaining the fact that contact resistance can be controlled by contact annealing temperature;

FIG. 4 is a diagram for explaining the fact that contact resistance can be controlled by the film thickness of Pt;

FIG. 6 is a diagram for explaining the fact that contact resistance can be controlled by contact annealing temperature;

FIG. 7A is part of a production process diagram of the second embodiment of the semiconductor light-emitting element;

FIG. 7B is part of a production process diagram of the second embodiment of the semiconductor light-emitting element;

FIG. 7C is part of a production process diagram of the second embodiment of the semiconductor light-emitting element;

FIG. 7D is part of a production process diagram of the second embodiment of the semiconductor light-emitting element;

FIG. 9 is a schematic sectional view of a semiconductor light-emitting element disclosed in Patent Document 1;

DETAILED DESCRIPTION OF THE INVENTION

A semiconductor light-emitting element according to the present invention and a method for producing the same will be described with reference to the accompanying drawings. It is to be noted that dimensional ratios in each of the drawings do not necessarily coincide with actual dimensional ratios.

First Embodiment

The structure of a first embodiment of the semiconductor light-emitting element according to the present invention and a method for producing the semiconductor light-emitting element according to the first embodiment will be described.

<Structure>

FIG. 1A is a schematic top view of the semiconductor light-emitting element according to the first embodiment. In FIG. 1A, light is extracted from a semiconductor light-emitting element 1 in a direction perpendicular to the plane of paper (Z direction).

Figure 1B:
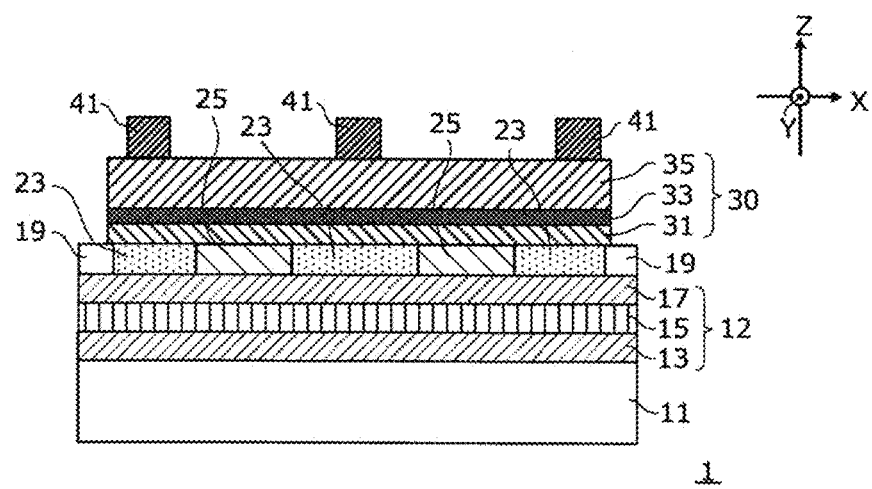
FIG. 1B is a schematic sectional view of the semiconductor light-emitting element taken along the B-B line in FIG. 1A.
Figure 1C:
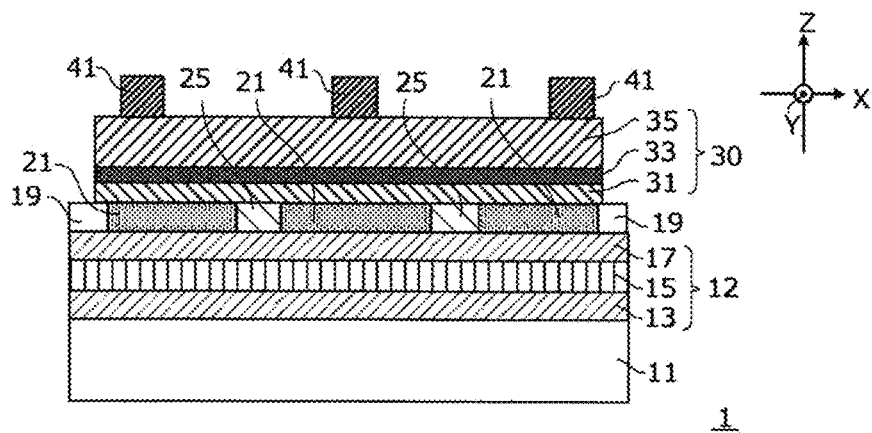
FIG. 1C is a schematic sectional view of the semiconductor light-emitting element taken along the C-C line in FIG. 1A.
Figure 1D:
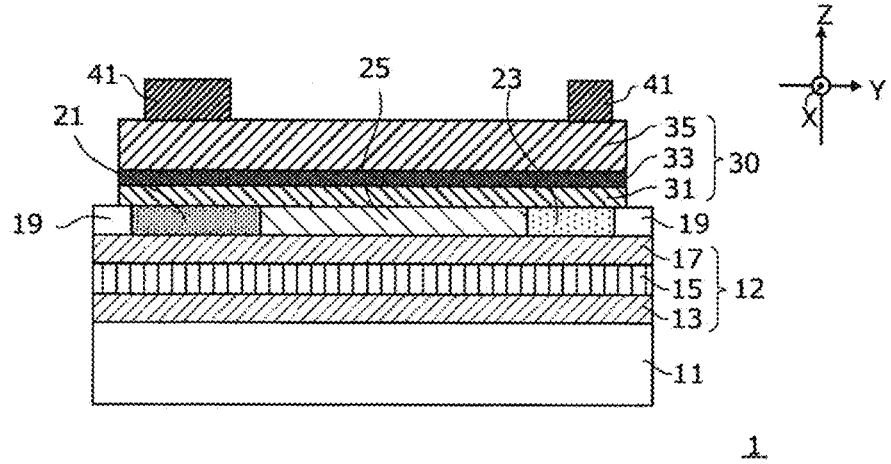
FIG. 1D is a schematic sectional view of the semiconductor light-emitting element taken along the D-D line in FIG. 1A.

FIG. 1B is a schematic sectional view of the semiconductor light-emitting element 1 taken along the B-B line in FIG. 1A. FIG. 1C is a schematic sectional view of the semiconductor light-emitting element 1 taken along the C-C line in FIG. 1A. FIG. 1D is a schematic sectional view of the semiconductor light-emitting element 1 taken along the D-D line in FIG. 1A.

The semiconductor light-emitting element 1 according to this embodiment includes a substrate 11, a conductive layer 12, an insulating layer 19, a semiconductor layer 30, a first electrode 41, a second electrode 25, a first current blocking layer 21, and a second current blocking layer 23. The semiconductor layer 30 is formed by stacking a p-type semiconductor layer 31, a light-emitting layer 33, and an n-type semiconductor layer 35 in this order from the bottom. It is to be noted that in each of the drawings, including FIG. 1A, shown below, a plane parallel to the surface of the substrate 11 is defined as an X-Y plane, and a direction perpendicular to this plane is defined as a Z direction.

(Substrate 11)

The substrate 11 is constituted from, for example, a conductive substrate such as CuW, W, or Mo or a semiconductor substrate such as Si.

(Conductive Layer 12)

The conductive layer 12 having a multi-layered structure is provided on the upper surface of the substrate 11. In this embodiment, the conductive layer 12 includes a protective layer 13, a solder layer 15, and a protective layer 17.

The solder layer 15 is made of, for example, Au—Sn, Au—In, Au—Cu—Sn, Cu—Sn, Pd—Sn, or Sn. This solder layer 15 functions as a layer for ensuring adhesion between the substrate 11 and another substrate (growth substrate 61 to be described later) when both the substrates are bonded together.

The protective layer 17 is made of, for example, a Pt-based metal (alloy of Ti and Pt), W, Mo, or Ni. As will be described later, when the substrate 11 and another substrate are bonded together with the solder layer being interposed between them, the protective layer 17 plays the function of preventing materials constituting solder from diffusing to the second electrode 25 side to prevent a reduction in luminous efficiency due to a reduction in the reflectivity of the second electrode 25.

(Semiconductor Layer 30)

As described above, the semiconductor layer 30 is formed by stacking the p-type semiconductor layer 31, the light-emitting layer 33, and the n-type semiconductor layer 35 in this order from the substrate 11 side.

The p-type semiconductor layer 31 is made of, for example, GaN or AlGaN, and is doped with a p-type impurity such as Mg, Be, Zn, or C.

The light-emitting layer 33 is constituted from, for example, a semiconductor layer having a multiquantum well structure including a plurality of periods of InGaN well layers and AlGaN barrier layers. These layers may be undoped or p- or n-type doped.

The n-type semiconductor layer 35 has, for example, a multi-layered structure including an AlGaN layer (electron supply layer) and a GaN layer (protective layer). At least the protective layer is doped with an n-type impurity such as Si, Ge, S, Se, Sn, or Te.

It is to be noted that the term "AlGaN" is an abbreviation for $Al_mGa_{1-m}N$ (0<m<1), and the omission of the compositional ratio between Al and Ga is not intended to limit the compositional ratio between Al and Ga to 1:1. The same shall apply to the term "InGaN". Also in the following description, these abbreviations are used in the same way as above.

(First Electrode 41)

The first electrode 41 is provided on the upper surface of the n-type semiconductor layer 35 in part of a region where the n-type semiconductor layer 35 is provided, and is made of, for example, Cr—Au. It is to be noted that as shown in FIG. 1A, the first electrode 41 has a wide portion in a position far from the center of the semiconductor light-emitting element 1 in the Y- direction, and in this region, a current supply part 43 connected to one end of a current supply line 45 is provided. The other end of the current supply line 45 is connected to a feed pattern or the like (not shown) of the substrate 11 provided in the semiconductor light-emitting element 1. It is to be noted that FIG. 1A shows a case where the semiconductor light-emitting element 1 has the current supply part 43 in two places, which is merely an example and is not intended to limit the number of the current supply parts 43.

The first electrode 41 extends lengthwise and widthwise along the surface (X-Y plane) of the substrate 11. A region surrounded by the extending first electrode 41, that is, a region where the first electrode 41 is not provided on the upper surface of the n-type semiconductor layer 35 corresponds to a light extraction surface. It is to be noted that the shape of the first electrode 41 is not limited to one shown in FIG. 1A. For example, the first electrode 41 may be formed to have a denser stripe pattern by increasing the number of lines extending in the Y direction or may be formed to have a grid pattern by further increasing the number of lines extending in the X direction.

(Second Electrode 25)

The second electrode 25 can be made of, for example, a metal material containing an Ag-based metal (alloy of Ni and Ag), Al, or Rh. In this embodiment, the second electrode 25 will be described with reference to a case where it has a multi-layered structure made of Ni/Ag.

The second electrode 25 is made of a conductive material that can reflect light emitted from the light-emitting layer 33, and forms an ohmic contact at its interface with the p-type semiconductor layer 31.

As shown in FIGS. 1B, 1C, and 1D, the second electrode 25 is provided in part of a region vertically below a region where the first electrode 41 is not provided. That is, the second electrode 25 is provided in a position not opposed to the first electrode 41 in the vertical direction (Z direction).

The second electrode 25 is provided in contact with the upper surface of the conductive layer 12 and the bottom surface of the semiconductor layer 30. In the case of this embodiment, the second electrode 25 is provided in contact with the upper surface of the protective layer 17 and the bottom surface of the p-type semiconductor layer 31.

(First Current Blocking Layer 21, Second Current Blocking Layer 23)

In this embodiment, the first current blocking layer 21 and the second current blocking layer 23 are made of the same metal material as the second electrode 25. However, the first current blocking layer 21 and the second current blocking layer 23 form a Schottky contact at their interface with the p-type semiconductor layer 31. That is, the contact resistance at the interface between the first current blocking layer 21 and the p-type semiconductor layer 31 and the contact resistance at the interface between the second current blocking layer 23 and the p-type semiconductor layer 31 are both higher than the contact resistance at the interface between the second electrode 25 and the p-type semiconductor layer 31.

Further, when the first current blocking layer 21 and the second current blocking layer 23 are compared, the contact resistance at the interface between the first current blocking layer 21 and the p-type semiconductor layer 31 is higher than the contact resistance at the interface between the second current blocking layer 23 and the p-type semiconductor layer 31. A method for making such a difference in the magnitude of the contact resistance at the interface with the p-type semiconductor layer 31 will be described later in the description of the production method.

Both the first current blocking layer 21 and the second current blocking layer 23 are provided in contact with the upper surface of the conductive layer 12 and the bottom surface of the semiconductor layer 30. In the case of this embodiment, the first current blocking layer 21 and the second current blocking layer 23 are both provided in contact with the upper surface of the protective layer 17 and the bottom surface of the p-type semiconductor layer 31.

As compared to the second current blocking layer 23, the first current blocking layer 21 is provided in a region nearer to the current supply part 43. That is, the first current blocking layer 21 is provided in a region including at least a region vertically below the current supply part 43. On the other hand, as compared to the first current blocking layer 21, the second current blocking layer 23 is provided farther from the current supply part 43 in the Y direction.

(Insulating Layer 19)

The insulating layer 19 is made of, for example, $SiO_2$, SiN, $Zr_2O_3$, AlN, or $Al_2O_3$. This insulating layer 19 is provided outside the semiconductor layer 30 in a direction parallel to the X-Y plane so as to function not only as an isolation layer for ensuring insulation between the adjacent semiconductor light-emitting elements but also as an etching stopper layer upon element separation as will be described later.

<Function>

As shown in FIG. 1D, the first current blocking layer 21 having a high contact resistance with the p-type semiconductor layer 31 is provided vertically below part of the first electrode 41 (first electrode 41 located on one side in the Y-direction in FIG. 1D) constituting the current supply part 43. Further, in a position far from the current supply part 43 in the Y direction, the second electrode 25 having the lowest contact resistance with the p-type semiconductor layer 31 is provided vertically below part of a region where the first electrode 41 is not provided. Further, in a position far from the current supply part 43 in the Y direction, the second current blocking layer 23 having a lower contact resistance with the p-type semiconductor layer 31 than the first current blocking layer 21 and having a higher contact resistance with the p-type semiconductor layer 31 than the second electrode 25 is provided vertically below a region where the first electrode 41 is provided.

When high electric current is supplied to the current supply part 43 of the semiconductor light-emitting element 1 through the current supply line 45, the electric current supplied to the current supply part 43 much less easily flows from the current supply part 43 in the Z direction (vertical direction). This is because, as described above, the first current blocking layer 21 having the highest contact resistance is provided vertically below the current supply part 43.

As described above with reference to FIG. 1A, the current supply part 43 constitutes part of the first electrode 41, and the first electrode 41 extends lengthwise and widthwise along the surface of the substrate 11 (X-Y plane). Further, in a position vertically below the first electrode 41, the second electrode 25 is not provided, but the first current blocking layer 21 or the second current blocking layer 23 that forms a Schottky contact at its interface with the semiconductor layer 30 is provided. Therefore, the electric current supplied to the current supply part 43 less easily flows vertically downward from the first electrode 41, but spreads through the first electrode 41 in a direction parallel to the X-Y plane and flows through the semiconductor layer 30 toward the conductive layer 12.

However, a slightly larger amount of electric current flows vertically downward in a position far from the current supply part 43 than in a position directly below the current supply part 43. This is because the second current blocking layer 23 having a lower contact resistance with the semiconductor layer 30 than the first current blocking layer 21 is provided in a position far from the current supply part 43 in a direction parallel to the X-Y plane and vertically below the first electrode 41.

That is, in the semiconductor light-emitting element 1, a layer having a high contact resistance with the semiconductor layer 30 is provided directly below the first electrode 41 to prevent most of electric current from flowing through the semiconductor layer 30 in the vertical direction. Particularly, a layer (first current blocking layer 21) having a higher contact resistance is provided in a position directly below the current supply part 43, to which electric current is to be supplied, than in a position far from the current supply part 43 to prevent concentration of electric current near the current supply part 43. Therefore, even when the semiconductor light-emitting element 1 is used as a high-power device, that is, even when high electric current is supplied from the current supply part 43, it is possible to prevent a region near the current supply part 43 from being exposed to high temperature due to concentration of electric current near the current supply part 43, thereby allowing the element to achieve a longer life than conventional ones.

It is to be noted that in the case of the structure of this embodiment, both the first current blocking layer 21 and the second current blocking layer 23 are made of the same metal material as the second electrode 25. Therefore, light emitted downward from the light-emitting layer 33 can be reflected not only by the surface of the second electrode 25 but also by the surface of the first current blocking layer 21 and the surface of the second current blocking layer 23 and then extracted from the light extraction surface. This makes it possible to achieve high light extraction efficiency.

Figure 14:
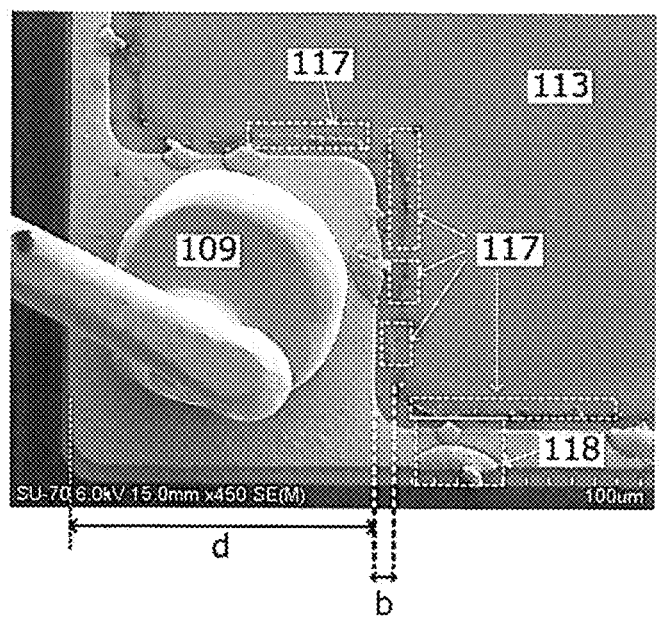
FIG. 14 is a photograph of the top surface of a semiconductor light-emitting element having a structure shown in FIG. 10, which was taken after high electric current is supplied to a current supply part of the semiconductor light-emitting element for a certain period of time.

Here, in the conventional semiconductor light-emitting element 100 shown in FIG. 14, the width of the current supply part 109 is defined as d and the distance from the edge of the current supply part 109 to the edge of the isolation layer 106 is defined as b. When these definitions are applied to the semiconductor light-emitting element 1 according to this embodiment, d corresponds to the width of the current supply part 43 and b corresponds to the distance from the edge of the current supply part 43 to the edge of the isolating layer 19. In order to relieve concentration of electric current near the current supply part 43, the first current blocking layer 21 is preferably provided so as to occupy the entire region vertically below the current supply part 43 and to further extend therefrom to some extent in a direction parallel to the X-Y plane. Here, the extension from the region vertically below the current supply part 43 is preferably achieved by forming the first current blocking layer 21 in at least a region vertically below a region between the edge of the current supply part 43 and the edge of the insulating layer 19. That is, when the width of the first current blocking layer 21 in a direction parallel to the X-Y plane is defined as D, D preferably satisfies a relationship represented by D d+b.

In the photograph shown in FIG. 14, d is 130 μm and b is 10 μm. In this case, it can be said that D preferably satisfies a relationship represented by D≥140 μm. In consideration of a design margin, the first current blocking layer 21 is preferably formed so that D satisfies a relationship represented by D≥1.1d.

On the other hand, if the first current blocking layer 21 is very large, electric current less easily flows toward a place far from the first current blocking layer 21, which is less effective at relieving concentration of electric current near the current supply part 43.

Figure 12:
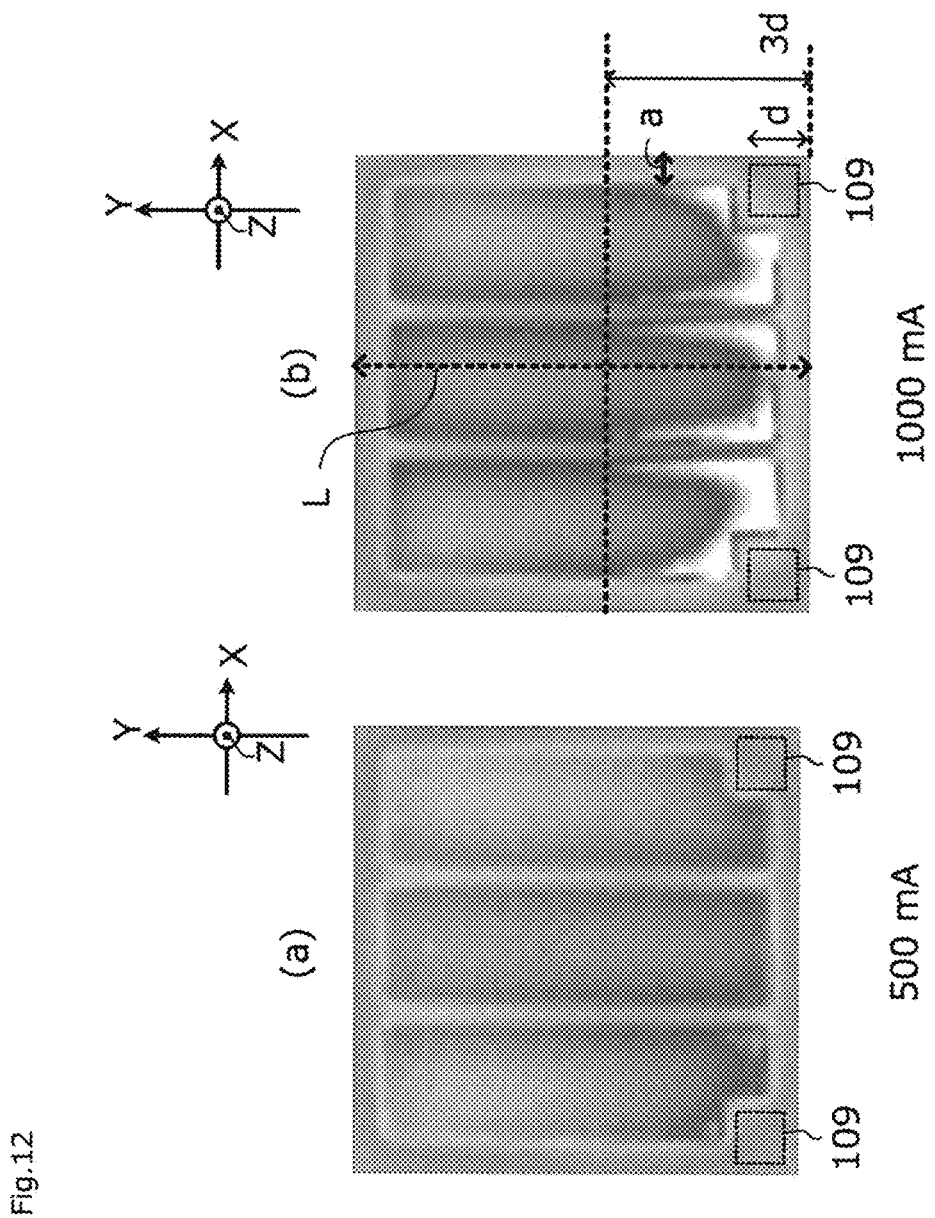
FIG. 12 is a photograph showing the temperature distribution of top surface of a semiconductor light-emitting element having a structure shown in FIG. 10 when an electric current of 500 mA or 1000 mA is supplied to a current supply part of the semiconductor light-emitting element.
Figure 13:
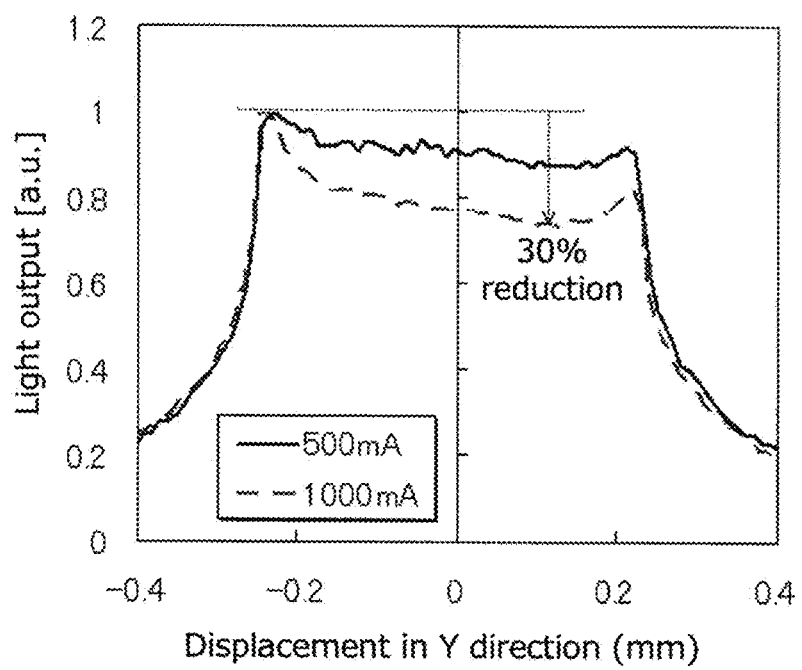
FIG. 13 is a graph showing the distribution of light output according to the position on a semiconductor light-emitting element having a structure shown in FIG. 10 when an electric current of 500 mA or 1000 mA is supplied to a current supply part of the semiconductor light-emitting element.

As can be seen from FIG. 12(*b*), when high electric current is supplied to the current supply part 109 in the conventional semiconductor light-emitting element 100, an area extending in the Y direction from a region where the current supply part 109 is provided to a region far from the region by a distance of 3d has a high temperature (d represents the width of the current supply part 109 as described above). It is to be noted that the semiconductor light-emitting element 100 shown in FIG. 12(*b*) is formed to have an element size L of 1 mm, a width d of the current supply part 109 of 130 μm, and a width a of the n-side electrode 108 of 18 μm.

Therefore, it is considered that formation of the first current blocking layer 21 in the semiconductor light-emitting element 1 according to this embodiment in a region far from a region where the current supply part 43 is provided by a distance of more than 3d is less effective from the viewpoint of relieving concentration of electric current near the current supply part 43. For this reason, when the width of the first current blocking layer 21 in a direction parallel to the X-Y plane is defined as D, D preferably satisfies a relationship represented by D≤3d. That is, the first current blocking layer 21 is preferably designed so that the width d satisfies a relationship represented by 1.1d≤D≤3d.

<First Production Method>

Hereinbelow, one example of a first method for producing the semiconductor light-emitting element 1 will be described with reference to schematic production process diagrams shown in FIGS. 2A to 2G and FIG. 3. It is to be noted that production conditions and sizes, such as film thickness, in the following description are merely examples, and are not limited to values shown below.

It is to be noted that in each of FIGS. 2A to 2G, (a) is a schematic top view, (b) is a schematic sectional view taken along the B-B line in (a), and (c) is a schematic sectional view taken along the C-C line in (a).

(Step S1)

As shown in FIG. 2A, an epitaxial layer 39 is formed on a growth substrate 61. This step S1 is performed by, for example, the following procedure.

(Preparation of Growth Substrate 61)

A c-plane sapphire substrate is prepared as the growth substrate 61, and is subjected to cleaning. More specifically, this cleaning is performed, for example, in the following manner. The growth substrate 61 (c-plane sapphire substrate) is placed in a treatment furnace of a MOCVD (Metal Organic Chemical Vapor Deposition) apparatus, and then the temperature in the furnace is increased to, for example, 1150° C. while hydrogen gas is fed into the treatment furnace at a flow rate of 10 slm.

(Formation of Undoped Layer 36)

A low-temperature buffer layer made of GaN is formed on the surface of the growth substrate 61, and a foundation layer made of GaN is further formed on the upper surface of the low-temperature buffer layer. These low-temperature buffer layer and the foundation layer correspond to an undoped layer 36.

Specifically, the undoped layer 36 is formed, for example, in the following manner. First, the pressure and temperature in the furnace of the MOCVD apparatus are set to 100 kPa and 480° C., respectively. Then, trimethylgallium (TMG) and ammonia are supplied into the treatment furnace as source gases for 68 seconds at flow rates of 50 μmol/min and 250000 μmol/min, respectively while nitrogen gas and hydrogen gas are fed into the treatment furnace as carrier gases at the same flow rate of 5 slm. In this way, a 20 nm-thick low-temperature buffer layer made of GaN is formed on the surface of the growth substrate 61.

Then, the temperature in the furnace of the MOCVD apparatus is increased to 1150° C. Then, TMG and ammonia are supplied into the treatment furnace as source gases for 30 minutes at flow rates of 100 μmol/min and 250000 μmol/ min, respectively while nitrogen gas and hydrogen gas are fed into the treatment furnace as carrier gases at flow rates of 20 slm and 15 slm, respectively. In this way, a 1.7 µm-thick foundation layer made of GaN is formed on the surface of the low-temperature buffer layer.

(Formation of n-Type Semiconductor Layer 35)

Then, an n-type semiconductor layer 35 is formed on the upper surface of the undoped layer 36. Specifically, the n-type semiconductor layer 35 is formed, for example, in the following manner.

First, the pressure in the furnace of the MOCVD apparatus is set to 30 kPa while the temperature in the furnace is kept at 1150° C. Then, TMG, trimethylaluminum (TMA), ammonia, and tetraethylsilane are supplied into the treatment furnace as source gases for 60 minutes at flow rates of 94 µmol/min, 6 µmol/min, 250000 µmol/min, and 0.013 µmol/min, respectively while nitrogen gas and hydrogen gas are fed into the treatment furnace as carrier gases at flow rates of 20 slm and 15 slm, respectively. In this way, a 2 mm-thick n-type semiconductor layer 35 having a composition of $Al_{0.06}Ga_{0.94}N$ and an Si concentration of $5 \times 10^{19}/cm^3$, for example, is formed on the upper surface of the undoped layer 36.

It is to be noted that after this, the source gases may further be supplied for 6 seconds in the same manner as described above except that the supply of TMA is stopped to achieve an n-type semiconductor layer 35 in which a protective layer having a thickness of about 5 nm and made of n-type GaN is provided on the upper surface of an n-type AlGaN layer.

The n-type semiconductor layer 35 has been described above with reference to a case where the layer 35 contains Si as an n-type impurity, but the n-type impurity may be Ge, S, Se, Sn, or Te instead of Si.

(Formation of Light-Emitting Layer 33)

Then, a light-emitting layer 33 having a multiquantum well structure with a plurality of periods of InGaN well layers and n-type AlGaN barrier layers is formed on the upper surface of the n-type semiconductor layer 35.

Specifically, first, the pressure and temperature in the furnace of the MOCVD apparatus are set to 100 kPa and 830° C., respectively. Then, a step is performed in which TMG, trimethylindium (TMI), and ammonia are supplied into the treatment furnace as source gases for 48 seconds at flow rates of 10 µmol/min, 12 µmol/min, and 300000 µmol/min, respectively while nitrogen gas and hydrogen gas are fed into the treatment furnace as carrier gases at flow rates of 15 slm and 1 slm respectively. Then, a step is performed in which TMG, TMA, tetraethylsilane, and ammonia are supplied into the treatment furnace for 120 seconds at flow rates of 10 µmol/min, 1.6 µmol/min, 0.002 µmol/min, and 300000 µmol/min, respectively. Then, these two steps are repeatedly performed so that a light-emitting layer 33 having a multiquantum well structure with 15 periods of 2 nm-thick InGaN well layers and 7 nm-thick n-type AlGaN barrier layers is formed on the upper surface of the n-type semiconductor layer 35.

(Formation of p-Type Semiconductor Layer 31)

Then, a p-type semiconductor layer 31 made of AlGaN is formed on the upper surface of the light-emitting layer 33. Specifically, the p-type semiconductor layer 31 is formed, for example, in the following manner.

Specifically, the pressure in the furnace of the MOCVD apparatus is maintained at 100 kPa, and the temperature in the furnace is increased to 1025° C. while nitrogen gas and hydrogen gas are fed into the treatment furnace as carrier gases at flow rates of 15 slm and 25 slm, respectively. Then, TMG, TMA, ammonia, and biscyclopentadienylmagnesium ($Cp_2Mg$) as a p-type impurity doping source are supplied into the treatment furnace as source gasses for 60 seconds at flow rates of 35 µmol/min, 20 µmol/min, 250000 µmol/min, and 0.1 µmol/min, respectively. In this way, a hole supply layer having a thickness of 20 nm and a composition of $Al_{0.3}Ga_{0.7}N$ is formed on the surface of the light-emitting layer 33. Then, the flow rate of TMA is changed to 4 µmol/min, and the source gases are supplied for 360 seconds to form a hole supply layer having a thickness of 120 nm and a composition of $Al_{0.13}Ga_{0.87}N$. These hole supply layers constitute the p-type semiconductor layer 31. The concentration of the p-type impurity in the p-type semiconductor layer 31 is, for example, about $3 \times 10^{19}/cm^3$.

It is to be noted that after this, the source gases may be further supplied for 20 seconds in the same manner as descried above except that the supply of TMA is stopped and the flow rate of $Cp_2Mg$ is changed to 0.2 µmol/min to form a p-type contact layer having a thickness of about 5 nm and a p-type impurity concentration of about $1 \times 10^{20}/cm^3$. In this case, the p-type semiconductor layer 31 also includes the p-type contact layer.

In this way, an epitaxial layer 39 including the undoped layer 36, the n-type semiconductor layer 35, the light-emitting layer 33, and the p-type semiconductor layer 31 is formed on the growth substrate 61. This step S1 corresponds to the step (a).

(Step S2)

The wafer obtained in the step S1 is subjected to activation treatment. More specifically, the activation treatment is performed using an RTA (Rapid Thermal Anneal) apparatus in a nitrogen atmosphere at 650° C. for 15 minutes.

(Step S3)

An insulating layer 19 is formed at a predetermined place on the upper surface of the p-type semiconductor layer 31 (see FIG. 2B).

More specifically, the insulating layer 19 is formed by sputtering $SiO_2$ to form a film having a film thickness of about 200 nm on the upper surface of the p-type semiconductor layer 31 in a region as a boundary with adjacent elements. It is to be noted that a material for use in forming the film is not particularly limited as long as it is an insulating material, and may be, for example, SiN or $Al_2O_3$. At this time, a region where the insulating layer 19 is not formed may be masked.

(Step S4)

A second electrode 25 is formed in a predetermined region on the upper surface of the p-type semiconductor layer 31 (see FIG. 2B). Specifically, the second electrode 25 is formed, for example, in the following manner.

A material film made of a predetermined conductive material is formed in a predetermined region on the upper surface of the p-type semiconductor layer 31. For example, an Ag layer having a film thickness of 150 nm and an Ni layer having a film thickness of 30 nm are formed in a predetermined region on the upper surface of the p-type semiconductor layer 31 with the use of a sputtering apparatus. It is to be noted that this material film may further have an Ni layer provided on the lower surface of the Ag layer and having a film thickness of about 1.5 nm to improve adhesion with the p-type semiconductor layer 31.

Then, contact annealing treatment is performed using an RTA apparatus or the like in a dry air or inert gas atmosphere at 400 to 550° C. for 60 to 300 seconds to form an ohmic contact between the material film and the p-type semiconductor layer 31. In this way, a second electrode 25 is formed. When annealing is performed in an inert gas atmosphere, diffusion of Ag to the p-type semiconductor layer 31 side due to migration can be reduced, and therefore Schottky effect can be further improved as compared to when annealing is performed in a dry air atmosphere.

It is to be noted that as shown in FIG. 2B, the second electrode 25 is formed so that its width in a region on the C-C line is smaller than that in a region on the B-B line. This is intended to allow the second electrode 25 to have a sufficient size while the second electrode 25 is kept away from a current supply part 43 to be formed later by a certain distance.

More specifically, in order to allow the second electrode 25 to have a sufficient size, the width of the second electrode 25 in a region on the C-C line may be increased to be the same as that in a region on the B-B line. In this case, however, the current supply part 43 (see FIG. 1A) and the second electrode 25 are too close to each other, and therefore electric current easily flows in the vertical direction from the current supply part 43 toward the second electrode 25. On the other hand, when the width of the second electrode 25 in a region on the B-B line is decreased to be the same as that in a region on the C-C line, a region occupied by the second electrode 25 is decreased so that the amount of electric current flowing through the semiconductor layer 30 is decreased. From such a viewpoint, the second electrode 25 is formed so that its width in a region on the C-C line, that is, in a region near a place where the current supply part 43 is to be formed is smaller than that in a region on the B-B line, that is, in a region far from a place where the current supply part 43 is to be formed.

However, the shape of the second electrode 25 shown in FIG. 2B is merely an example, and the shape of the second electrode 25 is not limited thereto. For example, the second electrode 25 may have a rectangular shape as long as a sufficient amount of electric current can be ensured in the semiconductor layer 31.

This step S4 corresponds to the step (b1). It is to be noted that the step S3 and the step S4 may be performed in reverse order.

(Step S5)

A second current blocking layer 23 is formed on the upper surface of the p-type semiconductor layer 31 in part of a region where the second electrode 25 is not provided (see FIG. 2C). Specifically, the second current blocking layer 23 is formed on the upper surface of the p-type semiconductor layer 31 in a region where the second electrode 25 is not provided and which is some distance away from a place, in which the current supply part 43 is to be formed, in the Y direction.

More specifically, for example, a material film including an Ag layer having thickness of 150 nm and an Ni layer having thickness of 30 nm is formed in a predetermined region on the upper surface of the p-type semiconductor layer 31 by a sputtering apparatus in the same manner as in the case of the step S4. Then, contact annealing treatment is performed using an RTA apparatus or the like in a dry air or inert gas atmosphere at a temperature lower than that used in the step S4, such as about 340 to 360° C., for 60 to 300 seconds.

The second current blocking layer 23 formed under the above temperature condition forms a Schottky contact at its interface with the p-type semiconductor layer 31. The contact resistance at the interface between the second current blocking layer 23 and the p-type semiconductor layer 31 is higher than that at the interface between the second electrode 25 and the p-type semiconductor layer 31.

This step S5 corresponds to the step (b3).

(Step S6)

Figure 2D:
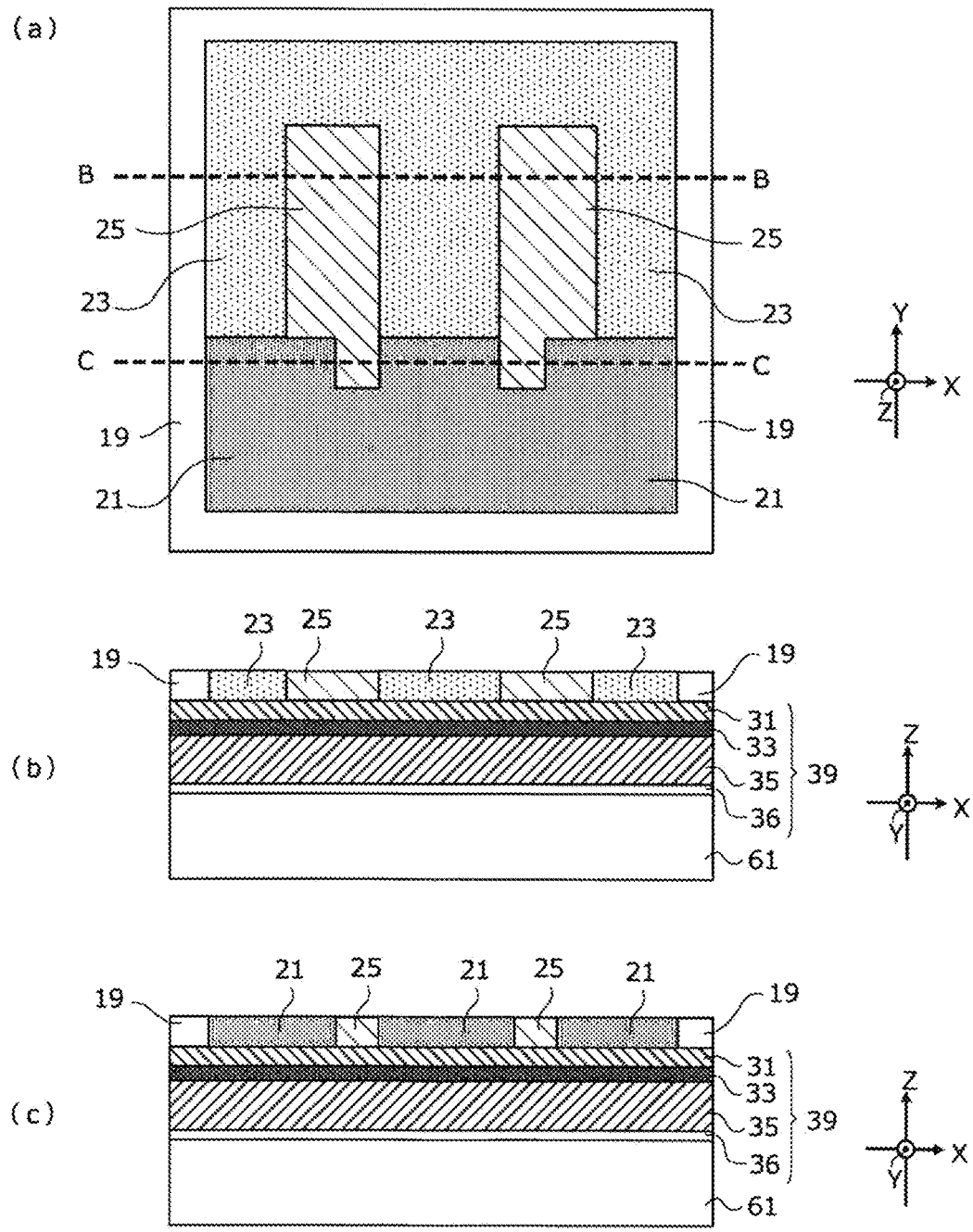
FIG. 2D is part of a production process diagram of the first embodiment of the semiconductor light-emitting element.

A first current blocking layer 21 is formed on the upper surface of the p-type semiconductor layer 31 in a region where the second electrode 25 and the second current blocking layer 23 are not provided (see FIG. 2D). That is, the first current blocking layer 21 is formed in a region closer to a place, in which the current supply part 43 is to be formed, than a region where the second current blocking layer 23 is provided.

More specifically, for example, as in the case of the step S5, a material film including an Ag layer having thickness of 150 nm and an Ni layer having thickness of 30 nm is formed on the upper surface of the p-type semiconductor layer 31 in a region where the second electrode 25 and the second current blocking layer 23 are not provided. Then, contact annealing treatment is performed using an RTA apparatus or the like in a dry air or inert gas atmosphere at a temperature lower than that used in the step S5, such as about 290 to 310° C., for 60 to 300 seconds.

The first current blocking layer 21 formed under the above temperature condition forms a Schottky contact at its interface with the p-type semiconductor layer 31. The contact resistance at the interface between the first current blocking layer 21 and the p-type semiconductor layer 31 is higher than that at the interface between the second electrode 25 and the p-type semiconductor layer 31, and is also higher than that the interface between the second current blocking layer 23 and the p-type semiconductor layer 31.

This step S6 corresponds to the step (b2).

Hereinbelow, with reference to FIG. 3, a description will be made of the fact that contact resistance can be controlled by contact annealing temperature. FIG. 3 shows a simulated element for validation and a graph showing the relationship between annealing temperature and the resistivity of the element for validation. An element 70 for validation shown in FIG. 3(a) has a structure in which an Ag layer 72 having thickness of 150 nm is provided on a p-type AlGaN layer 71, and an Ni layer 73 having thickness of 30 nm is provided on the upper surface of the Ag layer 72. The Ag layer 72 and the Ni layer 73 simulate the material film formed in the step S5 or step S6.

FIG. 3(b) is a graph showing the relationship between annealing temperature and the resistivity of the element 70 for validation, which was determined by performing contact annealing treatment at different annealing temperatures after formation of the Ag layer 72 and the Ni layer 73 on the p-type AlGaN layer 71 by evaporation and then by measuring the resistivity of the element 70 for validation. In FIG. 3(b), the resistivity at an annealing temperature of 400° C. is about 500 $\Omega$m, but this is the value of the resistance at a non-contact point and the resistance at a contact point is almost 0, that is, an ohmic contact is achieved. It is to be noted that the resistivity at an annealing temperature of 450° C. is almost the same as that at an annealing temperature of 400° C., which indicates that an ohmic contact is achieved also at an annealing temperature of 450° C.

On the other hand, the contact resistance at an annealing temperature of 350° C. is higher than that at an annealing temperature of 400° C. Further, the contact resistance at an annealing temperature of 300° C. is higher than that at an annealing temperature of 350° C. This indicates that a Schottky contact can be formed between the p-type AlGaN layer 71 and the Ag layer 72 by decreasing the annealing temperature and that the contact resistance can be increased by decreasing the annealing temperature.

It is to be noted that the step S4, the step S5, and the step S6 are arranged in descending order of annealing temperature. That is, these steps need to be performed in descending order of annealing temperature for contact annealing treatment. This is because if the step S5 and the step S6 are performed in reverse order, that is, if the step 5, in which contact annealing treatment is performed at an annealing temperature higher than that used in the step S6, is performed after the step S6, there is a possibility that the interface between the first current blocking layer 21 formed in the step 6 and the p-type semiconductor layer 31 is exposed to high temperature during the step 5 so that the contact resistance at the interface is reduced.

(Step S7)

A protective layer 17 is formed on the entire upper surface of the second electrode 25, the first current blocking layer 21, and the second current blocking layer 23 so as to extend across them. Then, a solder layer 15 is formed on the upper surface of the protective layer 17 (see FIG. 2E).

More specifically, a layer including three periods of Ti layers with a film thickness of 100 nm and Pt layers with a film thickness of 200 nm is formed by an electron-beam deposition apparatus (EB apparatus) as a protective layer 17. Then, a Ti layer with a film thickness of 10 nm is further formed by evaporation on the upper surface (Pt surface) of the protective layer 17, and then Au—Sn solder containing 80% Au and 20% Sn is evaporated onto the Ti layer to form a solder layer 15 with a film thickness of 3 μm.

(Step S8)

Then, a protective layer 13 is formed in the same manner as the protective layer 17 on a substrate 11 prepared separately from the growth substrate 61. As described above, a conductive substrate such as CuW, W, or Mo or a semiconductor substrate such as Si can be used as the substrate 11.

Then, the growth substrate 61 and the substrate 11 are bonded together. For example, the solder layer 15 formed over the growth substrate 61 and the protective layer 17 formed on the upper surface of the substrate 11 are bonded together at a temperature of 280° C. and a pressure of 0.2 MPa (see FIG. 2E).

It is to be noted that the solder layer 15 may be formed also on the upper surface of the protective layer 17 provided on the substrate 11. In this case, the solder layer 15 provided over the substrate 11 and the solder layer 15 provided over the growth substrate 61 are bonded together.

(Step S9)

Then, the growth substrate 61 is separated. More specifically, the growth substrate 61 and the substrate 11 bonded together are placed in a state where the growth substrate 61 is located on the upper side and the substrate 11 is located on the lower side, and are irradiated with a KrF excimer laser from the growth substrate 61 side to decompose the interface between the growth substrate 61 and the epitaxial layer 39. In this way, the growth substrate 61 is separated.

When a sapphire substrate is used as the growth substrate 61, a laser can pass through sapphire but is absorbed by GaN (undoped layer 36) located under the growth substrate 61. Therefore, the temperature at the interface between the growth substrate 61 and GaN is increased so that GaN is decomposed and the growth substrate 61 is separated.

Then, GaN (undoped layer 36) remaining on the wafer is removed by wet etching using hydrochloric acid or the like or dry etching using an ICP apparatus to expose the n-type semiconductor layer 35. It is to be noted that the undoped layer 36 is removed in this step S9, and as a result, a semiconductor layer 30 remains in which the p-type semiconductor layer 31 the light-emitting layer 33, and the n-type semiconductor layer 35 are stacked in this order from the bottom (see FIG. 2F).

(Step S10)

Figure 2G:
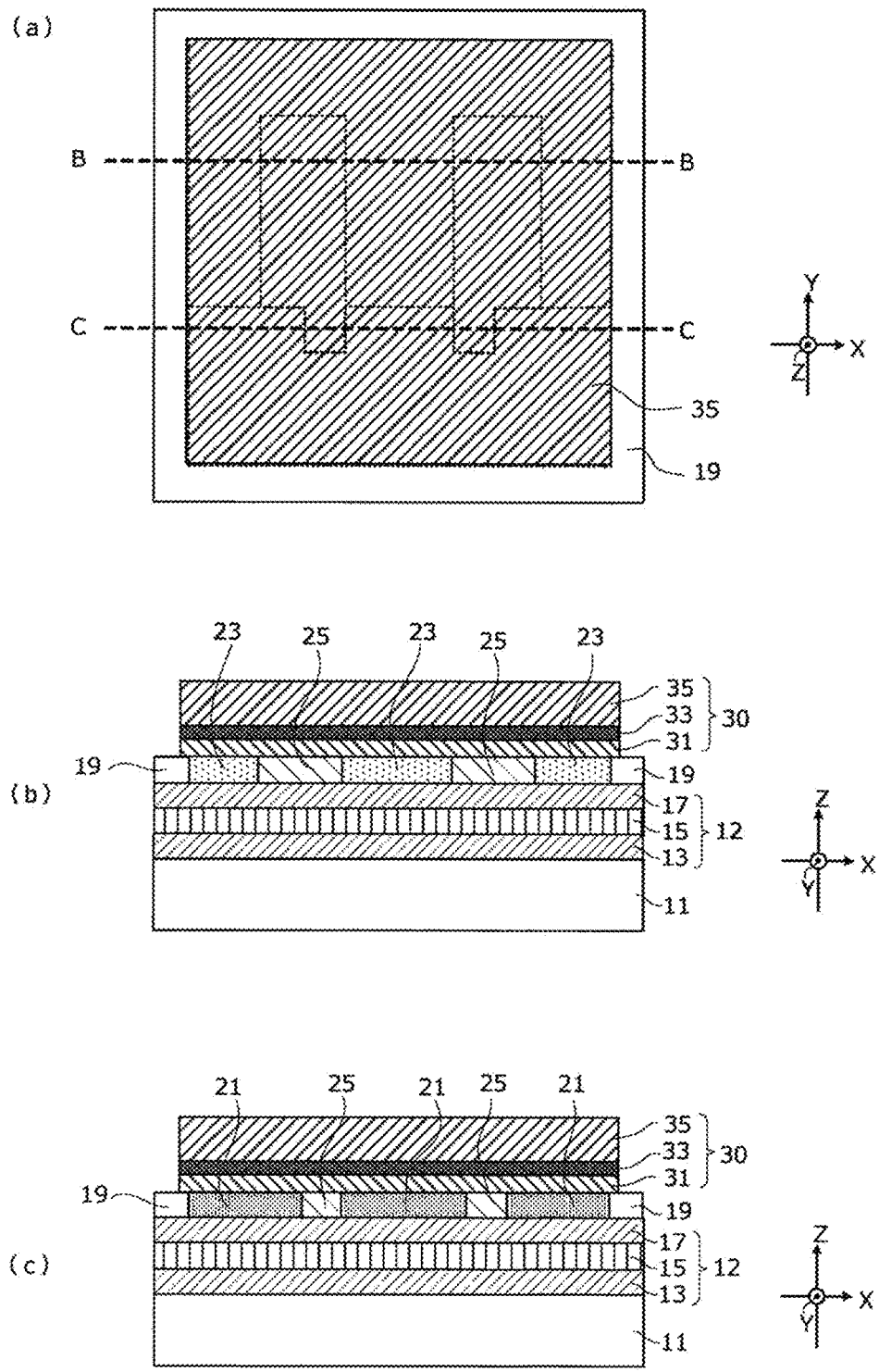
FIG. 2G is part of a schematic process diagram of the first embodiment of the semiconductor light-emitting element.

Then, as shown in FIG. 2G, adjacent elements are separated from each other. Specifically, the semiconductor layer 30 is etched in a region as a boundary with adjacent elements using an ICP apparatus until the upper surface of the insulating layer 19 is exposed. At this time, the insulating layer 19 functions as an etching stopper as described above.

(Step S11)

Then, a first electrode 41 is formed on the upper surface of the n-type semiconductor layer 35 in a predetermined region, more specifically in part of a region excluding a region vertically above a region where the second electrode 25 is provided, that is, in part of a region vertically above the first current blocking layer 21 and part of a region vertically above the second current blocking layer 23. The first electrode 41 is formed by, for example, forming a Cr layer with a film thickness of 100 nm and an Au layer with a film thickness of 3 μm by evaporation and then performing annealing treatment in a nitrogen atmosphere at 250° C. for about 1 minute. This step S11 corresponds to the step (c).

(Step S12)

Then, the adjacent elements are separated from each other by, for example, a laser dicing apparatus, and the back surface of the substrate 11 is bonded to a package with, for example, an Ag paste. Further, wire bonding is performed to connect a current supply line 45 to the current supply part 43 constituting part of the first electrode 41 provided vertically above the first current blocking layer 21. The wire bonding is performed by, for example, connecting the current supply line 45 made of Au to a bonding region of φ100 μm with the application of a load of 50 g. This step S12 corresponds to the step (d).

The semiconductor light-emitting element 1 shown in FIGS. 1A to 1D is formed through the above steps S1 to S12.

It is to be noted that in the above-described production method, the material film formed in the step S4 to form the second electrode 25, the material film formed in the step S5 to form the second current blocking layer 23, and the material film formed in the step S6 to form the first current blocking layer 21 are all made of the same materials. However, any material can be used as long as it can reflect light emitted from the light-emitting layer 33 and can control the contact resistance at its interface with the p-type semiconductor layer 31 according to annealing temperature.

Alternatively, the material films formed to form the first current blocking layer 21 and the second current blocking layer 23 may be made of a material not having the function of reflecting light emitted from the light-emitting layer 33 as long as at least the material film formed to form the second electrode 25 is made of a material having such a reflective function as described above. However, in this case, the reflecting function is lower than that of the semiconductor light-emitting element 1 produced by the above-described production method. Therefore, from the viewpoint of further improving light extraction efficiency, all the material films are preferably made of a material that can reflect light emitted from the light-emitting layer 33.

<Second Production Method>

Hereinbelow, one example of a second method for producing the semiconductor light-emitting element 1 will be described. It is to be noted that the description of overlapping points between the first and second production methods will not be repeated by giving notice to that effect.

First, as in the case of the first production method, the steps S1 to S3 are performed.

(Step S4A)

A material film made of a predetermined conductive material is formed in a predetermined region on the upper surface of the p-type semiconductor layer 31. Here, a multi-layered film of Ag/Ni/Ti/Pt is used as the material film. More specifically, an Ag layer with a film thickness of 130 nm, an Ni layer with a film thickness of 30 nm, a Ti layer with a film thickness of 20 nm, and a Pt layer with a film thickness of 30 nm are formed in a predetermined region on the upper surface of the p-type semiconductor layer 31 by, for example, a sputtering apparatus. It is to be noted that an Ni layer with a film thickness of about 1.5 nm may be formed on the lower surface of the Ag layer to improve adhesion between the material film and the p-type semiconductor layer 31.

Then, contact annealing treatment is performed using an RTA apparatus or the like in a dry air or inert gas atmosphere at a temperature of 400 to 550° C. for 60 to 300 seconds to form an ohmic contact between the material film and the p-type semiconductor layer 31. In this way, a second electrode 25 is formed (see FIG. 2B). This step S4A corresponds to the step (b1).

(Step S5A)

Then, a material film made of a predetermined conductive material is formed on the upper surface of the p-type semiconductor layer 31 in a region where the second electrode 25 is not provided and which is some distance away from a place, in which a current supply part 43 is to be formed, in the Y direction. Here, as in the case of the step S4A, a multi-layered film of Ag/Ni/Ti/Pt is used. More specifically, an Ag layer with a film thickness of 130 nm, an Ni layer with a film thickness of 30 nm, a Ti layer with a film thickness of 20 nm, and a Pt layer with a film thickness of 20 nm, which is smaller than that in the step S4A, are formed in a predetermined region on the upper surface of the p-type semiconductor layer 31 by, for example, a sputtering apparatus. It is to be noted that an Ni layer with a film thickness of about 1.5 nm may be formed on the lower surface of the Ag layer to improve adhesion between this material film and the p-type semiconductor layer 31.

Then, contact annealing treatment is performed using an RTA apparatus or the like in a dry air or inert gas atmosphere at a temperature of 400 to 550° C. for 60 to 300 seconds. The film thickness of the Pt layer formed as the uppermost layer is smaller than that in the step S4A, and therefore a Schottky contact is formed between the conductive material and the p-type semiconductor layer 31 even when contact annealing is performed at the same annealing temperature as in the step S4A. In this way, a second current blocking layer 23 is formed as in the case of the step S5 in the first production method (see FIG. 2C). More specifically, the second current blocking layer 23 forms a Schottky contact at its interface with the p-type semiconductor layer 31, and therefore the contact resistance at the interface between the second current blocking layer 23 and the p-type semiconductor layer 31 is higher than that at the interface between the second electrode 25 and the p-type semiconductor layer 31.

This step S5A corresponds to the step (b3).

(Step S6A)

Then, a material film made of a predetermined conductive material is formed on the upper surface of the p-type semiconductor layer 31 in a region where the second electrode 25 and the second current blocking layer 23 are not provided. Here, as in the case of the step S4A and the step S5A, a multi-layered film of Ag/Ni/Ti/Pt is used. More specifically, an Ag layer with a film thickness of 130 nm, an Ni layer with a film thickness of 30 nm, a Ti layer with a film thickness of 20 nm, and a Pt layer with a film thickness of 10 nm, which is smaller than that in the step S5A, are formed by, for example, a sputtering apparatus.

Then, contact annealing treatment is performed using an RTA apparatus or the like in a dry air or inert gas atmosphere at a temperature of 400 to 550° C. for 60 to 300 seconds. The film thickness of the Pt layer formed as the uppermost layer is smaller than that in the step S4A, and therefore a Schottky contact is formed between the conductive material and the p-type semiconductor layer 31 even when contact annealing is performed at the same annealing temperature as in the step S4A. Further, the film thickness of the Pt layer formed as the uppermost layer is smaller than that in the step S5A, and therefore the contact resistance between the material film and the p-type semiconductor layer 31 can be further increased. In this way, a first current blocking layer 21 is formed as in the case of the step S6 in the first production method (see FIG. 2D). More specifically, the first current blocking layer 21 forms a Schottky contact at its interface with the p-type semiconductor layer 31, and therefore the contact resistance between the first current blocking layer 21 and the p-type semiconductor layer 31 is higher than that between the second electrode 25 and the p-type semiconductor layer 31, and is also higher than that between the second current blocking layer 23 and the p-type semiconductor layer 31.

This step S6A corresponds to the step (b2).

Hereinbelow, with reference to FIG. 4, a description will be made of the fact that contact resistance can be controlled by the film thickness of an uppermost Pt layer. FIG. 4 shows a simulated element for validation and a graph showing the relationship between the film thickness of a Pt layer and the resistivity of the element for validation. In an element 70a for validation shown in FIG. 4(*a*), an Ni layer 73a with a film thickness of 1.5 nm is provided on a p-type AlGaN layer 71, an Ag layer 72 with a film thickness of 150 nm is provided on the upper surface of the Ni layer 73a, an Ni layer 73 with a film thickness of 30 nm is provided on the upper surface of the Ag layer 72, a Ti layer 74 with a film thickness of 20 nm is provided on the upper surface of the Ni layer 73, and a Pt layer 75 is provided on the upper surface of the Ti layer 74. It is to be noted that the element 70a for validation has a structure in which adjacent two elements are electrically separated by an element separation insulating layer 76, but the two elements may be formed so as to be spatially separated from each other without forming the element separation insulating layer 76.

FIG. 4(*b*) is a graph showing the relationship between the film thickness of the Pt layer 75 and the resistance of the element 70a for validation, which was determined by performing contact annealing treatment under predetermined annealing conditions after formation of the Pt layers 75 different in film thickness and then by measuring the resistance between the adjacent two elements with the use of a probe 77. More specifically, the graph in FIG. 4(*b*) shows the relationship between the film thickness of the Pt layer 75 and the resistance of the element 70a for validation when contact annealing treatment was performed in an air atmosphere of 550° C. for 2 minutes or in an air atmosphere of 500° C. for 2 minutes.

As shown in FIG. 4(*b*), the resistance is lowest when the film thickness of the Pt layer 75 is 30 nm irrespective of the annealing conditions. At this point, an ohmic contact is formed at the interface between the Ag layer 72 and the p-type AlGaN layer 71. The resistance is increased as the film thickness of the Pt layer 75 is reduced to 20 nm and then 10 nm. The reason for this is considered to be that a reduction in the film thickness of the Pt layer 75 facilitates incorporation of oxygen in the air into the Ti layer 74 so that a Schottky barrier is formed due to formation of Ti oxide. It is to be noted that the resistance is increased when the film thickness of the Pt layer 75 is increased to 50 nm, which is considered to result from a reduction in the concentration of oxygen supplied to the Ni layer 73 due to an increase in the film thickness of the Pt layer 75.

That is, unlike the first production method, the second production method is capable of controlling the contact resistance at the interface between the conductive material and the semiconductor layer 30 (p-type semiconductor layer 31) even at the same annealing temperature. It is to be noted that in the above-described method, the contact resistance is controlled by controlling the film thickness of the uppermost Pt layer constituting the conductive material, but it is considered that the contact resistance can be controlled by adjusting the concentration of oxygen in an atmosphere during annealing.

It is to be noted that the element 70a for validation shown in FIG. 4 for use in resistance measurement includes the Ni layer 73a provided on the p-type AlGaN layer 71, but does not necessarily need to have the Ni layer 73a.

After the step S6A is performed, as in the case of the first production method, the steps S7 to S12 are performed in order. In this way, a semiconductor light-emitting element 1 shown in FIGS. 1A to 1D is formed.

It is to be noted that in the second production method, the film thickness of the uppermost Pt layer differs among the steps S4A, S5A, and S6A while the same annealing temperature is used in the steps S4A, S5A, and S6A, but as in the case of the first production method, the annealing temperature may also differ among the steps S4A, S5A, and S6A.

Second Embodiment

The structure of a second embodiment of the semiconductor light-emitting element according to the present invention and a method for producing the semiconductor light-emitting element according to the second embodiment will be described. It is to be noted that components common to the first and second embodiments are denoted by the same reference signs.

<Structure>

Figure 5A:
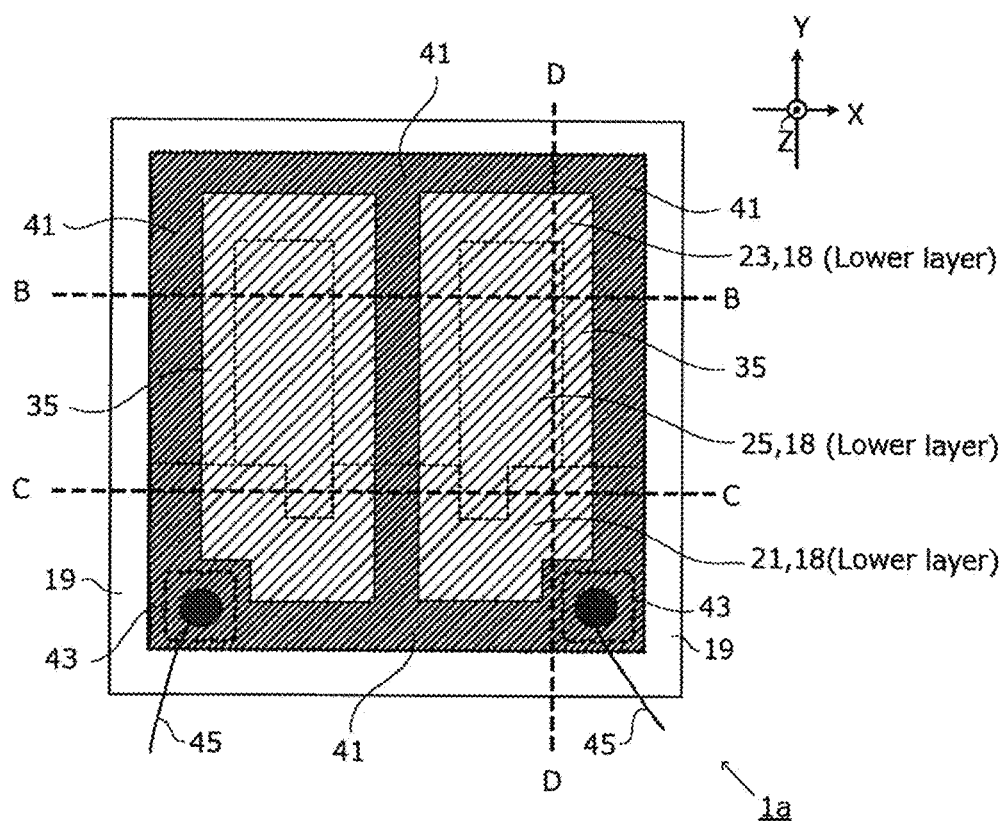
FIG. 5A is a schematic top view of a semiconductor light-emitting element according to a second embodiment of the present invention.

FIG. 5A is a schematic top view of the semiconductor light-emitting element according to the second embodiment. In FIG. 5A, light is extracted from a semiconductor light-emitting element 1a in a direction perpendicular to the plane of paper (Z direction).

Figure 5B:
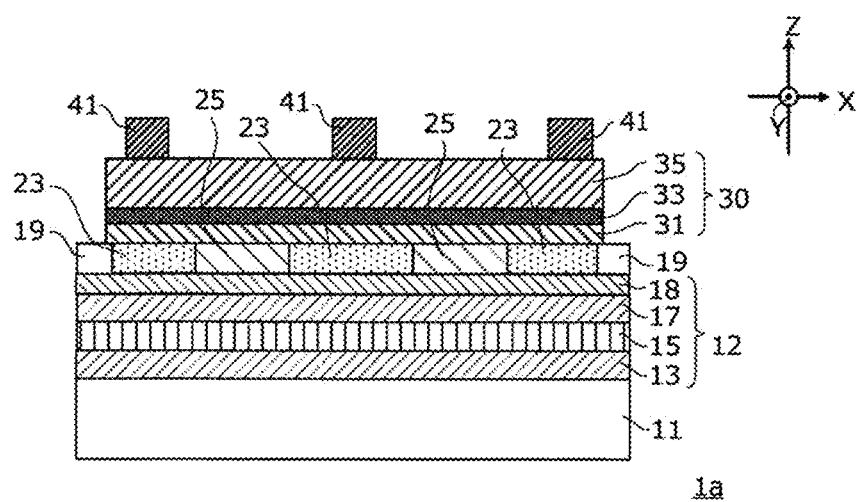
FIG. 5B is a schematic sectional view of the semiconductor light-emitting element taken along the B-B line in FIG. 5A.

FIG. 5B is a schematic sectional view of the semiconductor light-emitting element 1a taken along the B-B line in FIG. 5A.

Figure 5C:
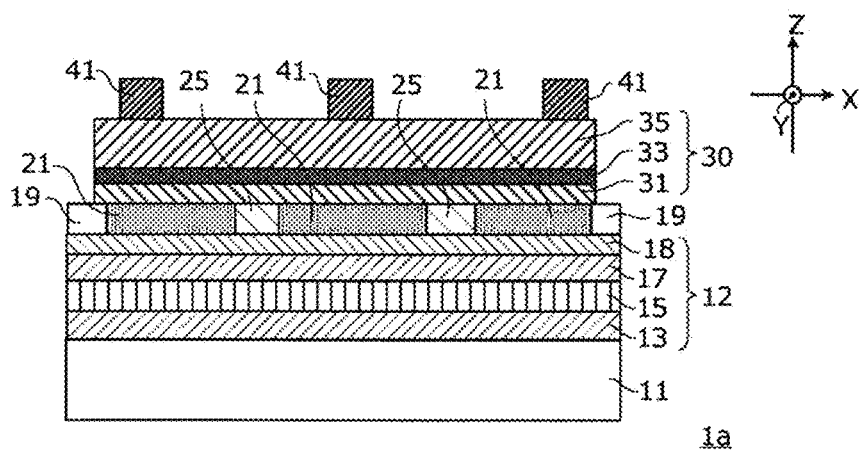
FIG. 5C is a schematic sectional view of the semiconductor light-emitting element taken along the C-C line in FIG. 5A.
Figure 5D:
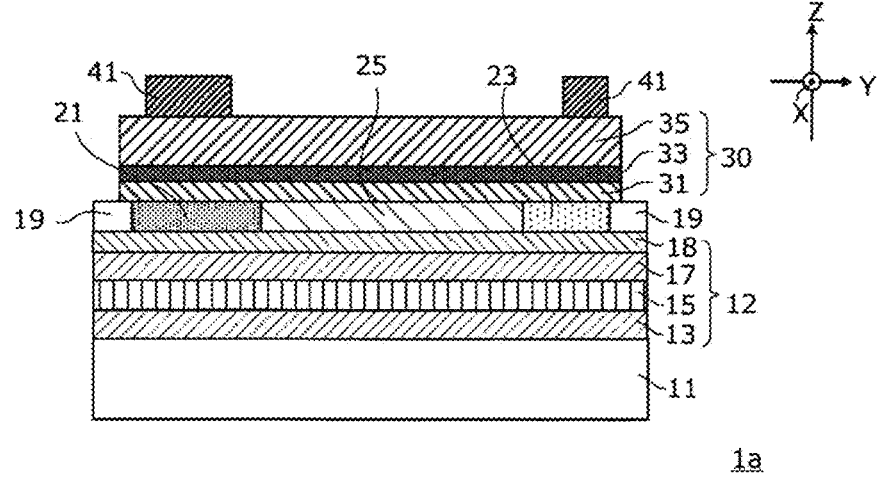
FIG. 5D is a schematic sectional view of the semiconductor light-emitting element taken along the D-D line in FIG. 5A.

FIG. 5C is a schematic sectional view of the semiconductor light-emitting element 1a taken along the C-C line in FIG. 5A. FIG. 5D is a schematic sectional view of the semiconductor light-emitting element 1a taken along the D-D line in FIG. 5A.

(Reflective Layer 18)

The semiconductor light-emitting element 1a is different from the semiconductor light-emitting element 1 according to the first embodiment in that a conductive reflective layer 18 is further provided. The reflective layer 18 is made of a conductive material having the function of reflecting light emitted from the light-emitting layer 33. The reflective layer 18 is provided as the uppermost layer constituting the conductive layer 12. Here, the reflective layer 18 can be made of, for example, the same material as the second electrode 25.

(First Current Blocking Layer 21, Second Current Blocking Layer 23)

In this embodiment, unlike the second electrode 25, the first current blocking layer 21 and the second current blocking layer 23 are formed of a conductive oxide film (e.g., ITO) having the property of transmitting light emitted from the light-emitting layer 33. It is to be noted that as in the case of the first embodiment, each of the first current blocking layer 21 and the second current blocking layer 23 forms a Schottky contact at its interface with the p-type semiconductor layer 31.

That is, the contact resistance at the interface between the first current blocking layer 21 and the p-type semiconductor layer 31 and the contact resistance at the interface between the second current blocking layer 23 and the p-type semiconductor layer 31 are both higher than the contact resistance at the interface between the second electrode 25 and the p-type semiconductor layer 31. Further, when the first current blocking layer 21 and the second current blocking layer 23 are compared, the contact resistance at the interface between the first current blocking layer 21 and the p-type semiconductor layer 31 is higher than the contact resistance at the interface between the second current blocking layer 23 and the p-type semiconductor layer 31.

The other components are the same as those of the semiconductor light-emitting layer 1 according to the first embodiment, and therefore the description thereof is not repeated.

<Function>

Also in the semiconductor light-emitting element 1a according to this embodiment, a layer (first current blocking layer 21, second current blocking layer 23) having a high contact resistance with the semiconductor layer 30 is provided directly below the first electrode 41, which prevents most of electric current from flowing through the first electrode 41 and then the semiconductor layer 30 in the vertical direction. Particularly, a layer (first current blocking layer 21) having a higher contact resistance is provided in a position directly below the current supply parts 43, to which electric current is supplied, than in a position far from the current supply part 43, which prevents concentration of electric current near the current supply parts 43. Therefore, even when the semiconductor light-emitting element 1a is used as a high-power device, that is, even when high electric current is supplied, it is possible to prevent a region near the current supply part 43 from being exposed to high temperature due to concentration of electric current near the current supply part 43, thereby allowing the element to achieve a longer life than conventional ones.

<Production Method>

Hereinbelow, one example of a method for producing the semiconductor light-emitting element 1a will be described with reference to schematic production process diagrams shown in FIGS. 2A to 2D and FIGS. 7A to 7D and FIG. 6. It is to be noted that the description of overlapping points between the method for producing the semiconductor light-emitting element 1 according to the first embodiment and the method for producing the semiconductor light-emitting element 1a will not be repeated by giving notice to that effect.

First, the steps S1 to S4 (see FIGS. 2A and 2B) are performed in the same manner as in the first embodiment. At this point, an epitaxial layer 39, an insulating layer 19, and a second electrode 25 are formed on a growth substrate 61.

(Step S5B)

As in the case of the step S5, a second current blocking layer 23 is formed on the upper surface of the p-type semiconductor layer 31 in part of a region where the second electrode 25 is not provided (see FIG. 2C). Specifically, the second current blocking layer 23 is formed on the upper surface of the p-type semiconductor layer 31 in a region where the second electrode 25 is not provided and which is some distance away from a place, in which a current supply part 43 is to be formed, in the Y direction.

More specifically, a material film made of ITO and having a film thickness of about 100 to 200 nm is formed in a predetermined region on the upper surface of the p-type semiconductor layer 31 by a sputtering apparatus. Then, contact annealing treatment is performed using an RTA apparatus or the like in a dry air or inert gas atmosphere at a temperature lower than that used in the step S4, such as about 300 to 350° C., for 60 to 300 seconds. The contact annealing is preferably performed in an inert gas atmosphere from the viewpoint of further improving light extraction efficiency, because the transmittance of ITO can be increased as compared to when the contact annealing is performed in a dry air atmosphere.

The second current blocking layer 23 formed under the above temperature condition forms a Schottky contact at the interface with the p-type semiconductor layer 31, and therefore the contact resistance between the second current blocking layer 23 and the p-type semiconductor layer 31 is higher than the contact resistance between the second electrode 25 and the p-type semiconductor layer 31.

This step S5B corresponds to the step (b3).

(Step S6B)

As in the case of the step S6, a first current blocking layer 21 is formed on the upper surface of the p-type semiconductor layer 31 in a region where the second electrode 25 and the second current blocking layer 23 are not provided (see FIG. 2D). That is, as in the case of the first embodiment, the first current blocking layer 21 is formed in a region closer to a place, in which the current supply part 43 is to be formed, than a region where the second current blocking layer 23 is provided.

Specifically, as in the case of the step S5B, a material film made of ITO and having a film thickness of about 100 to 200 nm is formed in a predetermined region on the upper surface of the p-type semiconductor layer 31 by a sputtering apparatus. Then, contact annealing treatment is performed using an RTA apparatus or the like in a dry air or inert gas atmosphere at a temperature lower than that used in the step S5B, such as about 250 to 300° C., for 60 to 300 seconds.

The first current blocking layer 21 formed under the above temperature condition forms a Schottky contact at its interface with the p-type semiconductor layer 31, and therefore the contact resistance between the first current blocking layer 21 and the p-type semiconductor layer 31 is higher than that between the second electrode 25 and the p-type semiconductor layer 31, and is also higher than that between the second current blocking layer 23 and the p-type semiconductor layer 31.

This step S6B corresponds to the step (b2).

Hereinbelow, with reference to FIG. 6, a description will be made of the fact that contact resistance can be controlled by contact annealing temperature also when ITO is formed. FIG. 6 shows a simulated element for validation and a graph showing the relationship between annealing temperature and the resistivity of the element for validation. In an element 70b for validation shown in FIG. 6(a), an ITO layer 78 with a film thickness of 150 nm is formed on a p-type AlGaN layer 71, and adjacent two elements are electrically separated by an element separation insulating layer 76. It is to be noted that the element 70b for validation has a structure in which adjacent two elements are electrically separated by the element separation insulating layer 76, but the two elements may be formed so as to be spatially separated from each other without forming the element separation insulating layer 76.

FIG. 6(b) is a graph showing the relationship between annealing temperature and the resistance between the adjacent two elements, which was determined by performing contact annealing treatment at different annealing temperatures after formation of the ITO layer 78 on the p-type AlGaN layer 71 by evaporation and then by measuring the resistance between the adjacent two elements with the use of a probe 77. FIG. 6(c) is a graph showing the current-voltage characteristics of the elements 70b for validation formed under different annealing conditions.

In this case, contact annealing was performed under five different temperature conditions of 200° C., 400° C., 600° C., 700° C., and 800° C. Further, results at the time when contact annealing was not performed after formation of the ITO layer 78 by evaporation are also shown for comparison.

As can be seen from FIGS. 6(b) and 6(c), an ohmic contact is formed between the p-type AlGaN layer 71 and the ITO layer 78 when the annealing temperature is 400° C. or higher, but on the other hand, a Schottky contact is formed between the p-type AlGaN layer 71 and the ITO layer 78 when the annealing temperature is 200° C. and when contact annealing treatment is not performed. It is to be noted that as shown in FIG. 6(b), when a comparison is made between a case where the annealing temperature is 400° C. and a case where the annealing temperature is 600° C., the contact resistance at an annealing temperature of 400° C. is slightly higher than that at an annealing temperature of 600° C. Further, when a comparison is made between a case where the annealing temperature is 200° C. and a case where the annealing temperature is 400° C., the contact resistance at an annealing temperature of 200° C. is much higher than that at an annealing temperature of 400° C.

Therefore, in the step S5B, the second current blocking layer 23 that forms a Schottky contact at its interface with the p-type semiconductor layer 31 is formed by forming a material film made of ITO and then performing contact annealing treatment at a temperature lower than 400° C. Further, in the step S6B, the first current blocking layer 21 that exhibits a higher contact resistance at its interface with the p-type semiconductor layer 31 than the second current blocking layer 23 is formed by forming a material film made of ITO and then performing contact annealing treatment at a temperature lower than that used in the step S5B.

(Step S7A)

A reflective layer 18 is formed on the entire upper surface of the second electrode 25, the first current blocking layer 21, and the second current blocking layer 23 so as to extend across them (see FIG. 7A). As described above, this reflective layer 18 is made of a conductive material having the function of reflecting light emitted from the light-emitting layer 33. The reflective layer 18 can be made of, for example, the same material as the second electrode 25.

Specifically, as in the case of the step S4, an Ag layer with a film thickness of 150 nm and an Ni layer with a film thickness of 30 nm are formed, and then contact annealing treatment is performed at a temperature equal to or lower than the annealing temperature used in the step S6B. In this way, a reflective layer 18 is formed. The contact annealing is performed to ensure adhesion between the reflective layer 18 and the second electrode 25, the first current blocking layer 21, and the second current blocking layer 23, and therefore does not need to be performed at such a high temperature as in the step S4.

This step S7A corresponds to the step (b4).

(Step S7B)

A protective layer 17 is formed on the upper surface of the reflective layer 18 in the same manner as in the step S7 in the first embodiment. Then, a solder layer 15 is formed on the upper surface of the protective layer 17 (see FIG. 7B).

(Steps S8 to S12)

Then, as in the case of the first embodiment, the steps S8 to S12 are performed. Specifically, as in the case of the step S8, a protective layer 13 is formed in the same manner as the protective layer 17 on a substrate 11 prepared separately from the growth substrate 61, and then the growth substrate 61 and the substrate 11 are bonded together (see FIG. 7B).

Then, as in the case of the step S9, the growth substrate 61 is separated, and then GaN (undoped layer 36) remaining on the wafer is removed to expose the n-type semiconductor layer 35 (see FIG. 7C). Then, as in the case of the step S10, adjacent elements are separated from each other (see FIG. 7D).

Then, as in the case of the step S11, a first electrode 41 is formed on the upper surface of the n-type semiconductor layer 35 in a predetermined region, more specifically in part of a region excluding a region vertically above a region where the second electrode 25 is provided, that is, in part of a region vertically above the first current blocking layer 21 and part of a region vertically above the second current blocking layer 23. Then, as in the case of the step S12, the adjacent elements are separated from each other by, for example, a laser dicing apparatus, and the back surface of the substrate 11 is bonded to a package with, for example, an Ag paste. Further, wire bonding is performed to connect a current supply line 45 to a current supply part 43 constituting part of the first electrode 41 provided vertically above the first current blocking layer 21. In this way, a semiconductor light-emitting element 1a shown in FIGS. 5A to 5D is formed.

Another Embodiment

Hereinbelow, a semiconductor light-emitting element according to another embodiment and a method for producing the same will be described.

<1>

Figure 8A:
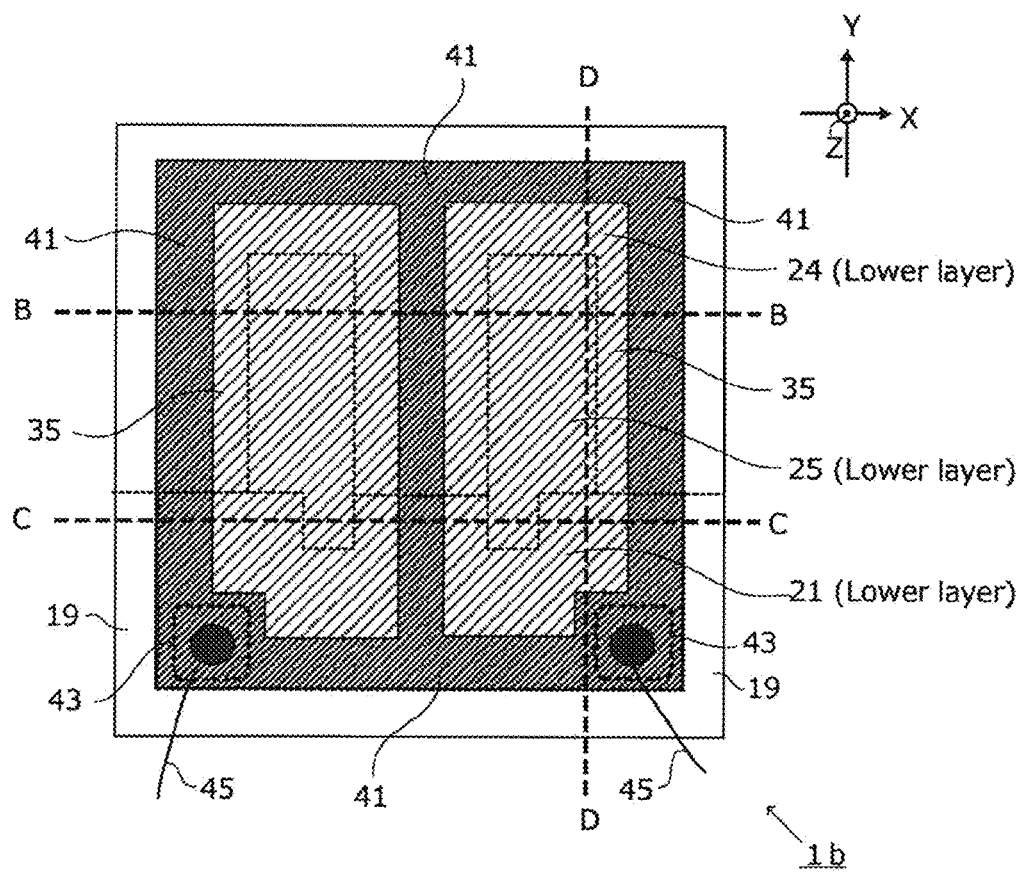
FIG. 8A is a schematic top view of a semiconductor light-emitting element according to another embodiment of the present invention.
Figure 8B:
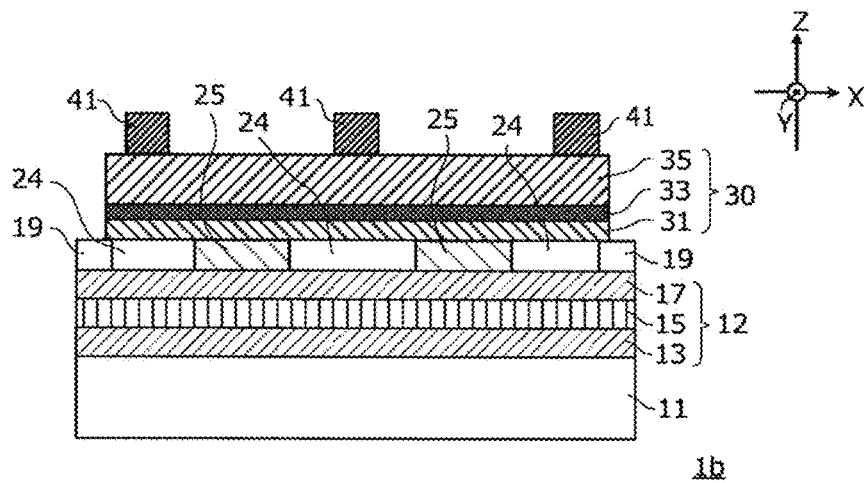
FIG. 8B is a schematic sectional view of the semiconductor light-emitting element taken along the B-B line in FIG. 8A.
Figure 8C:
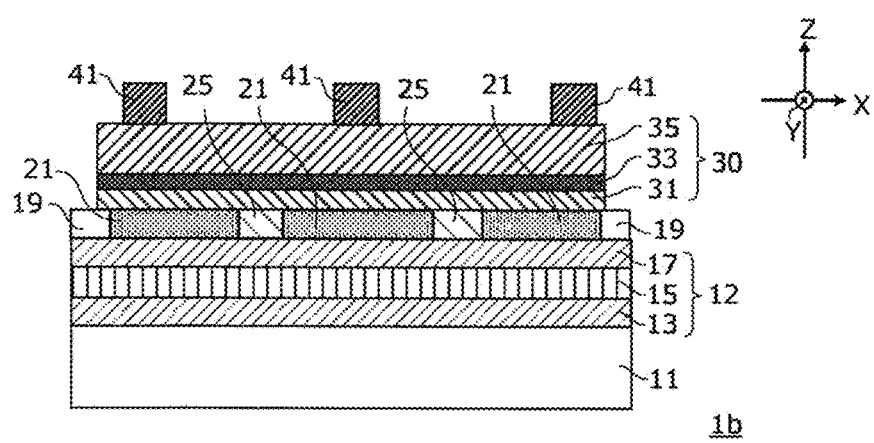
FIG. 8C is a schematic sectional view of the semiconductor light-emitting element taken along the C-C line in FIG. 8A.
Figure 8D:
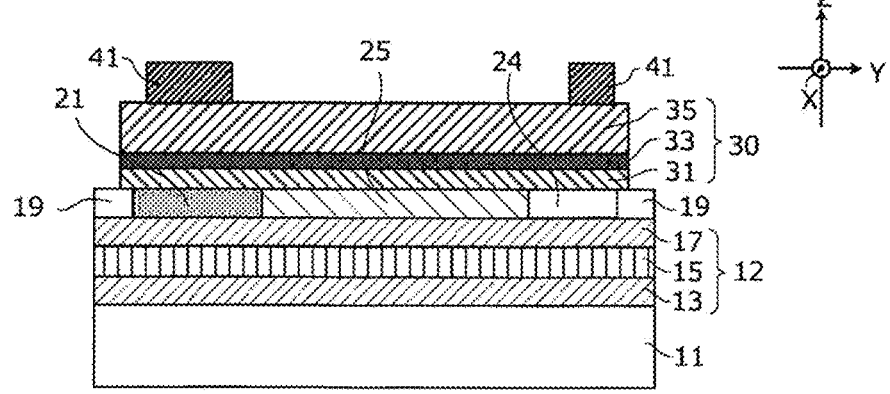
FIG. 8D is a schematic sectional view of the semiconductor light-emitting element taken along the D-D line in FIG. 8A.
Figure 10:
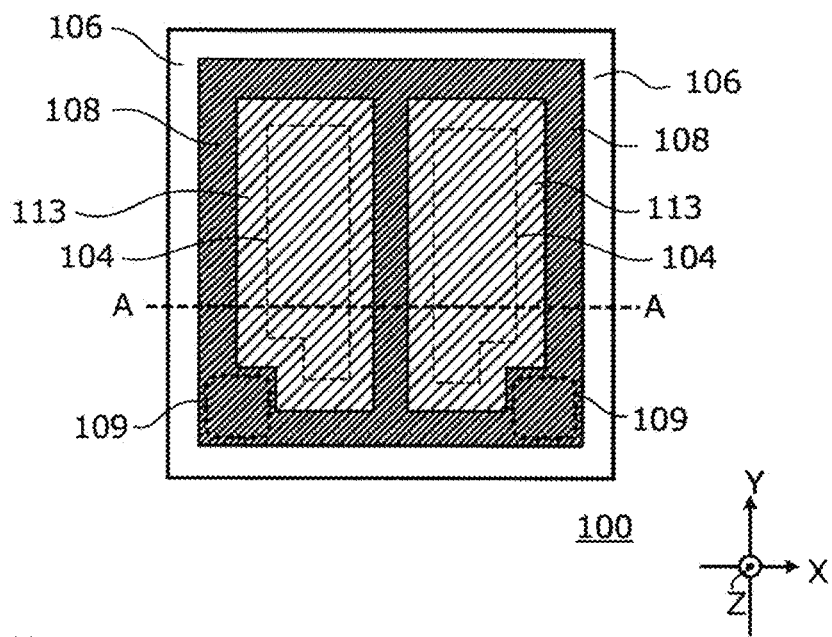
FIG. 10 is a schematic top view of the semiconductor light-emitting element disclosed in Patent Document 1.
Figure 11:
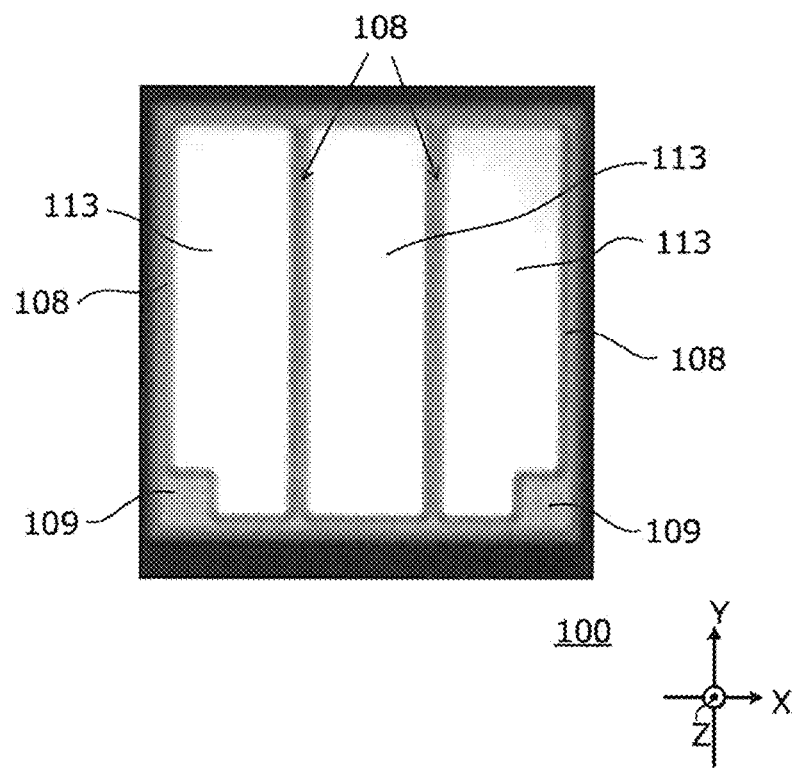
FIG. 11 is a photograph of the top surface of a semiconductor light-emitting element having a structure shown in FIG. 10.

FIGS. 8A to 8D are schematic views showing the structure of a semiconductor light-emitting element 1b according to another embodiment. FIG. 8A is a schematic top view of the semiconductor light-emitting element 1b, FIG. 8B is a schematic sectional view of the semiconductor light-emitting element 1b taken along the B-B line in FIG. 8A, FIG. 8C is a schematic sectional view of the semiconductor light-emitting element 1b taken along the C-C line in FIG. 8A, and FIG. 8D is a schematic sectional view of the semiconductor light-emitting element 1b taken along the D-D line in FIG. 8A.

As in the case of each of the above-described embodiments, the semiconductor light-emitting element 1b includes the first current blocking layer 21 provided in a region including a region vertically below the current supply part 43. However, unlike each of the above-described embodiments, the semiconductor light-emitting element 1b includes an insulating layer 24 instead of the second current blocking layer 23. It is to be noted that the insulating layer 24 may be made of the same material as the insulating layer 19, but may be made of a different material.

Also in the case of the semiconductor light-emitting element 1b having such a structure as described above, electric current supplied to the current supply part 43 much less easily flows from the current supply part 43 in the Z direction (vertical direction) because the first current blocking layer 21 having a high contact resistance is provided vertically below the current supply part 43. Therefore, electric current supplied from the current supply part 43 does not flow vertically downward, but spreads through the first electrode 41 in a direction parallel to the X-Y plane and flows through the semiconductor layer 30 toward the conductive layer 12. This makes it possible to relieve concentration of electric current near the current supply part 43.

However, in the case of the structure of the semiconductor light-emitting element 1b, the insulating layer 24 having a high resistance is provided also in a position that is far from the current supply part 43 in the Y direction and that is located vertically below the first electrode 41. Therefore, the semiconductor light-emitting element 1b is less effective at spreading electric current to a position far from the current supply part 43 in the Y direction than the above-describe elements according to the first and second embodiments.

It is to be noted that as in the case of the semiconductor light-emitting element 1a according to the second embodiment, the structure shown in FIGS. 8A to 8D may include the reflective layer 18 for the purpose of improving light extraction efficiency. In this case, the reflective layer 18 is provided on the lower surface of the second electrode 25, the first current blocking layer 21, and the insulating layer 24.

<2>

The above-described semiconductor light-emitting element 1a according to the second embodiment has a structure in which the reflective layer 18 is provided on the lower surface of the first current blocking layer 21 and the second current blocking layer 23, which are both made of a light permeable material such as ITO, for the purpose of improving light extraction efficiency. However, even when both the first current blocking layer 21 and the second current blocking layer 23 are made of a light permeable material such as ITO, the reflective layer 18 does not necessarily need to be provided. However, light extraction efficiency is higher when the reflective layer 18 is provided than when the reflective layer 18 is not provided.

<3>

The material film constituting the second electrode 25 may be appropriately selected according to the wavelength of light emitted from the light-emitting layer 33. For example, when light emitted from the light-emitting layer 33 has a wavelength in the deep-ultraviolet range less than 350 nm, the second electrode 25 may be made of a material containing Al. Further, when light emitted from the light-emitting layer 33 has a wavelength in the range of 350 nm or more but 590 nm or less, that is, in the range from ultraviolet to yellow, the second electrode 25 may be made of a material containing Ag. Further, when light emitted from the light-emitting layer 33 has a wavelength in the range of more than 590 nm, that is, in the range from orange to infrared, the second electrode 25 may be made of a material containing Ag, Cu, or Au.

It is to be noted that when the first current blocking layer 21 and the second current blocking layer 23 as well as the second electrode 25 are made of a material having the function of reflecting light emitted from the light-emitting layer 33, the material may also be appropriately selected according to the wavelength of light emitted from the light-emitting layer 33 as in the case of the second electrode 25.

<4>

The above embodiments have been described with reference to a case where the second electrode 25 is provided in part of a region vertically below a region where the first electrode 41 is not provided. However, the second electrode 25 is not limited thereto as long as it is provided in part of a region vertically below a region where at least the current supply part 43 is not provided. Therefore, for example, part of the second electrode 25 may be located vertically below the first electrode 41. However, from the viewpoint of further spreading electric current, flowing through the semiconductor layer 30, in a direction parallel to the surface of the substrate 11, it is preferred that, as in the case of the above-described embodiments, the second electrode 25 is not provided in a position vertically below a region where the first electrode 41 is provided.

The invention claimed is:

1. A semiconductor light-emitting element comprising:
   a substrate;
   a semiconductor layer that is provided over the substrate and comprises a p-type semiconductor layer, a light-emitting layer, and an n-type semiconductor layer;
   a first electrode that is provided in contact with part of an upper surface of the semiconductor layer and comprises a current supply part connected to a current supply line;
   a second electrode that is provided in part of a region vertically below a region where the current supply part is not provided, that is in contact with part of a bottom surface of the semiconductor layer, and that is made of a material that reflects light emitted from the light-emitting layer;
   a first current blocking layer that is provided in a region including a region vertically below the current supply part and that is in contact with part of the bottom surface of the semiconductor layer,
   wherein a contact resistance at an interface between the first current blocking layer and the semiconductor layer is higher than that at an interface between the second electrode and the semiconductor layer; and
   a second current blocking layer that is provided in a region including a region vertically below a region where the first electrode is provided, that is located in a position farther from the current supply part than a place, in which the first current blocking layer is provided, in a direction parallel to a surface of the substrate, and that is in contact with part of the bottom surface of the semiconductor layer,
   wherein a contact resistance at an interface between the second current blocking layer and the semiconductor layer is higher than that at an interface between the second electrode and the semiconductor layer and is lower than that at an interface between the first current blocking layer and the semiconductor layer.

2. The semiconductor light-emitting element according to claim 1, comprising a conductive layer provided over the substrate,
   wherein a bottom surface of the second electrode, a bottom surface of the first current blocking layer, and a bottom surface of the second current blocking layer are in contact with an upper surface of the conductive layer.

3. The semiconductor light-emitting element according to claim 1, wherein the first current blocking layer and the second current blocking layer are made of a material that reflects light emitted from the light-emitting layer.

4. The semiconductor light-emitting element according to claim 3, wherein the first current blocking layer and the second current blocking layer are made of a metal material containing Ag, Al, Ni, Ti, or Pt.

5. The semiconductor light-emitting element according to claim 2, wherein the conductive layer comprises a reflective layer of which an uppermost layer is made of a material that reflects light emitted from the light-emitting layer, and
   wherein the first current blocking layer and the second current blocking layer are made of a material that transmits light emitted from the light-emitting layer.

6. The semiconductor light-emitting element according to claim 5, wherein the first current blocking layer and the second current blocking layer are made of a material containing ITO.

7. The semiconductor light-emitting element according to claim 1, wherein when a width of the current supply part and a width of the first current blocking layer in a direction parallel to the surface of the substrate are defined as d and D, respectively, d and D satisfy a relationship represented by $1.1d \leq D \leq 3d$.

8. A method for producing the semiconductor light-emitting element which comprises a substrate; a semiconductor layer that is provided over the substrate and comprises a p-type semiconductor layer, a light-emitting layer, and an n-type semiconductor layer; a first electrode that is provided in contact with part of an upper surface of the semiconductor layer and comprises a current supply part connected to a current supply line; a second electrode that is provided in part of a region vertically below a region where the current supply part is not provided, that is in contact with part of a bottom surface of the semiconductor layer, and that is made of a material that reflects light emitted from the light-emitting layer; and a first current blocking layer that is provided in a region including a region vertically below the current supply part and that is in contact with part of the bottom surface of the semiconductor layer, wherein a contact resistance at an interface between the first current blocking layer and the semiconductor layer is higher than that at an interface between the second electrode and the semiconductor layer, the method comprising:
   a step (a) in which the semiconductor layer is formed on a substrate;
   a step (b1) in which a material film for forming the second electrode is formed in a predetermined region on a first surface of the semiconductor layer, and then contact annealing treatment is performed to form the second electrode;
   a step (b2) in which, after the step (b1) is performed, a material film for forming the first current blocking layer is formed on the first surface of the semiconductor layer in a predetermined region where the second electrode is not provided, and then contact annealing treatment is performed at a temperature lower than that used in the step (b1) to form the first current blocking layer;
   a step (c) in which, after the step (b2) is performed, the first electrode is formed on a second surface of the semiconductor layer that is on a side opposite to the first surface; and
   a step (d) in which the current supply part connected to the current supply line is formed on the first electrode in part of a region opposed to the first current blocking layer in a direction perpendicular to a surface of the substrate.

9. The method for producing the semiconductor light-emitting element according to claim 8, comprising a step (b3) in which, after the step (a) and the step (b1) are performed, a material film for forming the second current blocking layer is formed on the first surface of the semiconductor layer in a predetermined region where the second electrode is not provided, and then contact annealing treatment is performed at a temperature lower than that used in the step (b1) but higher than that used in the step (b2) to form the second current blocking layer, wherein the step (b2) is a step in which, after the step (b3) is performed, a material film for forming the first current blocking layer is formed on the first surface of the semiconductor layer in a place where the second electrode and the second current blocking layer are not provided, and then contact annealing treatment is performed at a temperature lower than those used in the step (b1) and the step (b3) to form the first current blocking layer.

10. The method for producing the semiconductor light-emitting element according to claim 8, wherein the material films formed in the steps (b1), (b2), and (b3) are made of a same metal material.

11. The method for producing the semiconductor light-emitting element according to claim 8, comprising, when the material film formed in the step (b1) is made of a metal material and the material films formed in the step (b2) and the step (b3) are made of ITO, a step (b4) in which, after the step (b2) is performed, a metal material film is formed to extend across the second electrode, the first current blocking layer, and the second current blocking layer, and then contact annealing treatment is performed at a temperature equal to or lower than that used in the step (b2) to form a reflective layer, wherein the step (c) is performed after the step (b4) is performed.

12. A method for producing the semiconductor light-emitting element which comprises a substrate; a semiconductor layer that is provided over the substrate and comprises a p-type semiconductor layer, a light-emitting layer, and an n-type semiconductor layer; a first electrode that is provided in contact with part of an upper surface of the semiconductor layer and comprises a current supply part connected to a current supply line; a second electrode that is provided in part of a region vertically below a region where the current supply part is not provided, that is in contact with part of a bottom surface of the semiconductor layer, and that is made of a material that reflects light emitted from the light-emitting layer; and a first current blocking layer that is provided in a region including a region vertically below the current supply part and that is in contact with part of the bottom surface of the semiconductor layer, wherein a contact resistance at an interface between the first current blocking layer and the semiconductor layer is higher than that at an interface between the second electrode and the semiconductor layer, the method comprising:

a step (a) in which the semiconductor layer is formed on a substrate;

a step (b1) in which a material film having a multi-layered structure comprising an uppermost Pt layer is formed in a predetermined region on a first surface of the semiconductor layer, and then contact annealing treatment is performed to form the second electrode;

a step (b2) in which, after the step (b1) is performed, the material film having a multi-layered structure comprising an uppermost Pt layer having a smaller film thickness than that in the step (b1) is formed on the first surface of the semiconductor layer in a place where the second electrode is not provided, and then contact annealing treatment is performed to form the first current blocking layer;

a step (c) in which, after the step (b2) is performed, the first electrode is formed on a second surface of the semiconductor layer that is on a side opposite to the first surface; and a step (d) in which the current supply part connected to the current supply line is formed on the first electrode in part of a region opposed to the first current blocking layer in a direction perpendicular to a surface of the substrate.

13. The method for producing the semiconductor light-emitting element according to claim 12, comprising a step (b3) in which, after the step (a) and the step (b1) are performed, the material film whose Pt layer has a smaller film thickness than that in the step (b1) but has a larger film thickness than that in the step (b2) is formed on the first surface of the semiconductor layer in a predetermined region where the second electrode is not provided, and then contact annealing treatment is performed to form the second current blocking layer, wherein the step (b2) is a step in which, after the step (b3) is performed, the material film whose Pt layer has a smaller film thickness than those in the step (b1) and the step (b3) is formed on the first surface of the semiconductor layer in a place where the second electrode and the second current blocking layer are not provided, and then contact annealing treatment is performed to form the first current blocking layer.

* * * * *